(12) United States Patent
Seong et al.

(10) Patent No.: US 10,872,730 B2
(45) Date of Patent: Dec. 22, 2020

(54) ELECTRONIC DEVICE INCLUDING VARIABLE CAPACITOR INCLUDING PHOTO-CONDUCTIVE MATERIAL AND METHOD FOR CONTROLLING THE SAME

(71) Applicant: Samsung Electronics Co., Ltd., Suwon-si (KR)

(72) Inventors: Kihyug Seong, Suwon-si (KR); Dongil Yang, Suwon-si (KR); Jongin Lee, Suwon-si (KR); Hyoseok Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/514,040

(22) Filed: Jul. 17, 2019

(65) Prior Publication Data

US 2020/0027663 A1    Jan. 23, 2020

(30) Foreign Application Priority Data

Jul. 20, 2018 (KR) .................. 10-2018-0084496

(51) Int. Cl.
*H01G 7/00* (2006.01)
*H04B 1/18* (2006.01)
(Continued)

(52) U.S. Cl.
CPC .............. *H01G 7/00* (2013.01); *H04B 1/18* (2013.01); *H01Q 9/0442* (2013.01);
(Continued)

(58) Field of Classification Search
CPC .......... H01G 7/00; H04B 1/18; H04B 1/0458; H01Q 7/00; H01Q 9/0442; H03J 1/04; H03J 3/20
See application file for complete search history.

(56) References Cited

U.S. PATENT DOCUMENTS 5,136,346 A    8/1992    Kornowski
6,759,668 B2   7/2004    Matsuo et al.
(Continued)

FOREIGN PATENT DOCUMENTS

JP    05-90557 A      4/1993
JP    2001-298201 A   10/2001
(Continued)

OTHER PUBLICATIONS

International Search Report dated Nov. 11, 2019, issued in an International application No. PCT/KR2019/008804.

*Primary Examiner* — Raymond R Chai
(74) *Attorney, Agent, or Firm* — Jefferson IP Law, LLP

(57) ABSTRACT

An electronic device is provided. The electronic device includes a first conductive layer, a second conductive layer that is formed to be opposite to the first conductive layer. The second conductive layer includes conductors that are electrically separated, and one or more photo-conductive members connected between the conductors. The electronic device further includes an insulating layer that is interposed between the first conductive layer and the second conductive layer, one or more light sources positioned to face the one or more photo-conductive members, and a control circuit. The control circuit outputs a specified light through the light source such that an electric conductivity of the photo-conductive member increases in response to a light, from among the photo-conductive members and some conductors are electrically connected with the photo-conductive member, and a capacitance value between the first conductive layer and the second conductive layer is changed.

20 Claims, 26 Drawing Sheets

(51) Int. Cl.
*H01Q 13/10* (2006.01)
*H01Q 9/04* (2006.01)
*H03J 1/04* (2006.01)
*H03J 3/20* (2006.01)

(52) U.S. Cl.
CPC .............. *H01Q 13/103* (2013.01); *H03J 1/04* (2013.01); *H03J 3/20* (2013.01)

(56) References Cited

U.S. PATENT DOCUMENTS

| | | | |
|---|---|---|---|
| 7,292,125 B2 | 11/2007 | Mansour et al. | |
| 9,761,307 B2* | 9/2017 | Shibata | G11C 16/3459 |
| 9,859,607 B2* | 1/2018 | Hwang | H01Q 1/243 |
| 10,003,121 B2* | 6/2018 | Tsai | H01Q 5/335 |
| 2002/0180585 A1* | 12/2002 | Kim | H04B 1/3833 |
| | | | 340/5.53 |
| 2004/0007661 A1 | 1/2004 | Matsuo et al. | |
| 2005/0201672 A1 | 9/2005 | Mansour et al. | |
| 2012/0009983 A1* | 1/2012 | Mow | H04B 1/40 |
| | | | 455/575.7 |
| 2012/0092228 A1 | 4/2012 | Ishida et al. | |
| 2019/0081394 A1* | 3/2019 | Edwards | H01Q 1/48 |

FOREIGN PATENT DOCUMENTS

| | | |
|---|---|---|
| JP | 2009-170667 A | 7/2009 |
| WO | 2010006440 A1 | 1/2010 |

\* cited by examiner

ELECTRONIC DEVICE INCLUDING VARIABLE CAPACITOR INCLUDING PHOTO-CONDUCTIVE MATERIAL AND METHOD FOR CONTROLLING THE SAME

CROSS-REFERENCE TO RELATED APPLICATION(S)

This application is based on and claims priority under 35 U.S.C. § 119 of a Korean patent application number 10-2018-0084496, filed on Jul. 20, 2018, in the Korean Intellectual Property Office, the disclosure of which is incorporated by reference herein in its entirety.

BACKGROUND

1. Field

The disclosure relates to a technology for applying a variable capacitor capable of changing a capacitance by using a photo-conductive material to an electronic device.

2. Description of Related Art

As mobile communication technologies develop, an electronic device, which is equipped with an antenna, such as a smartphone or a wearable device is being widely supplied. The electronic device transmits/receives a voice signal, and a radio frequency (RF) signal including data (e.g., a message, a photo, a video, a music file, or a game) by using the antenna.

The electronic device tunes an antenna for transmitting/receiving signals of various radio frequencies more efficiently by using the antenna. To make the efficiency of the antenna better, the electronic device includes a tuner that adjusts an impedance of the antenna such that a resonance is made at a target (or intended) frequency. The tuner includes a variable capacitor for the purpose of changing the impedance of the antenna.

A variable capacitor included in the tuner of the antenna may be implemented with a complementary metal-oxide semiconductor (CMOS) to which a silicon-on-insulator (SOI) technology is applied. In this case, a capacitance value of the variable capacitor may be generally changed by connecting a plurality of lumped capacitors and a CMOS switch.

Alternatively, the variable capacitor included in the tuner of the antenna may be implemented based on micro electro mechanical systems (MEMS). In this case, a capacitance value of the variable capacitor may be changed by placing a movable electrode to be opposite to a reference electrode.

Meanwhile, the electronic device includes a communication module or circuits, which are mounted on a printed circuit board (PCB) to perform various functions, in addition to the tuner of the antenna. The communication module or the circuits may include a variable capacitor for the purpose of controlling a capacitance value between specified nodes of the communication module or the circuits.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device for applying a variable capacitor.

Additional aspects will be set forth in part in the description which follows and, in part, will be apparent from the description, or may be learned by practice of the presented embodiments.

In the case of implementing a variable capacitor included in a tuner of an antenna with a complementary metal-oxide semiconductor (CMOS) switch and a lumped capacitor, a resistance may increase when the CMOS switch is turned on and may decrease when the CMOS switch is turned off. The variable capacitor implemented with the CMOS switch and the lumped capacitor may be problematic in that the efficiency of the antenna is not improved due to the loss of the antenna.

Also, in the case where the CMOS switch and the lumped capacitor are connected, a capacitance may increase when the CMOS switch is turned off, a minimum value of a capacitance capable of being implemented with the variable capacitor may be great, and an operation between capacitance values may be great. As such, the variable capacitor implemented with the CMOS switch and the lumped capacitor has a limit to improve a performance of an antenna by changing a resonance frequency of the antenna.

In the case where a variable capacitor included in a tuner of an antenna is implemented based on the micro electro mechanical systems (MEMS), a minimum value of a capacitance capable of being implemented with the variable capacitor may be great. Also, the MEMS may require a separate voltage control unit for the purpose of changing a status of a variable capacitor by moving an electrode. In addition, the MEMS may operate abnormally when an antenna has a great impedance. As such, there is a limit to apply the variable capacitor implemented based on the MEMS to a wireless terminal or a portable electronic device.

In accordance with an aspect of the disclosure, an electronic device is provided. The electronic device includes a first conductive layer, and a second conductive layer that is formed to be opposite to the first conductive layer. The second conductive layer includes a plurality of conductors that are electrically separated and one or more photo-conductive members positioned to be connected between the plurality of conductors. The electronic device further includes an insulating layer that is interposed between the first conductive layer and the second conductive layer, one or more light sources that are positioned to face the one or more photo-conductive members, and a control circuit. The control circuit is configured to output a specified light through at least one light source of the one or more light sources such that an electric conductivity of the one or more photo-conductive members increases in response to a light, from among the one or more photo-conductive members, wherein at least some of the plurality of conductors that are electrically connected with the one or more photo-conductive members are connected, and a capacitance value between the first conductive layer and the second conductive layer is changed.

In accordance with another aspect of the disclosure, a capacitor device is provided. The capacitor device includes one or more light sources, a control circuit configured to control the one or more light sources, a first conductive layer, a second conductive layer that is formed to be opposite to the first conductive layer. The second layer includes a plurality of conductors that are electrically separated, and one or more photo-conductive members are positioned to correspond to the one or more light sources in a state where the one or more photo-conductive members are connected between the plurality of conductors, and an insulating layer that is interposed between the first conductive layer and the second conductive layer.

In accordance with another aspect of the disclosure, an electronic device is provided. The electronic device includes a first conductive layer, and a second conductive layer that is formed to be opposite to the first conductive layer. The second layer includes a plurality of conductors that are electrically separated, and one or more photo-conductive members connected between the plurality of conductors. The electronic device further includes an insulating layer that is interposed between the first conductive layer and the second conductive layer, one or more light sources that are positioned to face the one or more photo-conductive members, and a control circuit. The control circuit is configured to output a specified light through at least one light source of the one or more light sources such that at least some of the plurality of conductors are electrically connected via the one or more photo-conductive members and a capacitance value between the first conductive layer and the second conductive layer is changed.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
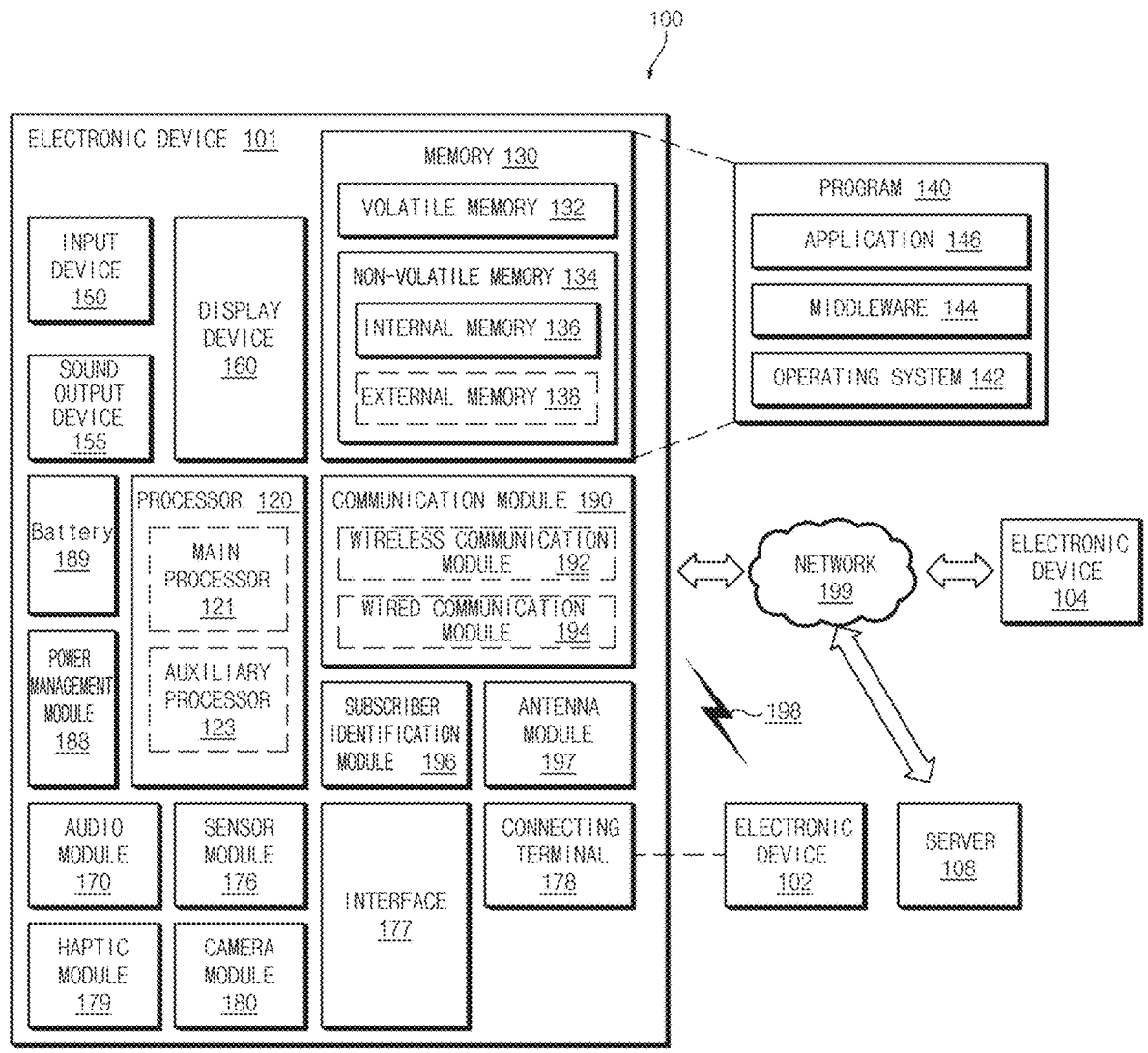
FIG. 1 is a block diagram illustrating an electronic device in a network environment according to an embodiment of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

FIGS. 2A, 2B, 3A, and 3B are block diagrams illustrating communication paths of the electronic device 101 according to various embodiments of the disclosure.

Referring to FIGS. 2A to 3B, the electronic device 101 may include the processor 120, the communication module 190, a transceiver 210, a pulse amplitude modulation (PAM) 220, a front end module (FEM) 230, a tuner 240, a coupler 250, and an antenna 260.

In an embodiment, the processor 120 may transmit/receive an RF signal together with the communication module 190. For example, the processor 120 may convert voice information included in the RF signal supplied from the communication module 190 into a voice to allow a user to recognize the voice or to talk over a phone. For another example, based on data included in the RF signal supplied from the communication module 190, the processor 120 may execute various applications or may update stored information.

In an embodiment, the processor 120 may include at least one of a central processing unit (CPU), an application processor (AP), a graphic processing unit (GPU), and an image signal processor (ISP) of a camera. According to an embodiment, the processor 120 may be implemented with a system on chip (SoC) or a system in package (SiP).

In an embodiment, the communication module 190 may include a baseband processor (BP), a communication processor (CP), a radio frequency integrated circuit (RFIC), or an inter frequency integrated circuit (IFIC).

In an embodiment, the communication module 190 may transmit/receive an RF signal together with the processor 120 and the transceiver 210. In the case where the communication module 190 includes the CP, the communication module 190 may convert data included in an RF signal provided from the transceiver 210 into data that are able to be processed by the processor 120 and may output the converted data to the processor 120.

In an embodiment, the transceiver 210 may exchange an RF signal with the communication module 190. The transceiver 210 may be connected with the PAM 220, the FEM 230, the tuner 240, and the coupler 250. The transceiver 210 may selectively supply an RF signal from the PAM 220, the FEM 230, the tuner 240, and the coupler 250 to the communication module 190. The transceiver 210 may selectively supply an RF signal from the communication module 190 to the PAM 220, the FEM 230, the tuner 240, and the coupler 250.

In an embodiment, the PAM 220 may modulate an RF signal to make it easy for the transceiver 210 to transmit/receive the RF signal. The PAM 220 may amplify the amplitude of an RF signal supplied from the FEM 230.

In an embodiment, the FEM 230 may be connected with the transceiver 210 and the PAM 220. The FEM 230 may include a duplexer for separating RF signals in different frequency bands such that the RF signals are prevented from being mixed. When a transmit/receive condition of an RF signal is good, the FEM 230 may directly transmit/receive the RF signal together with the transceiver 210. When a magnitude of an RF signal is a specified magnitude or smaller, the FEM 230 may provide the RF signal to the transceiver 210 by using the PAM 220.

Figure 2A:
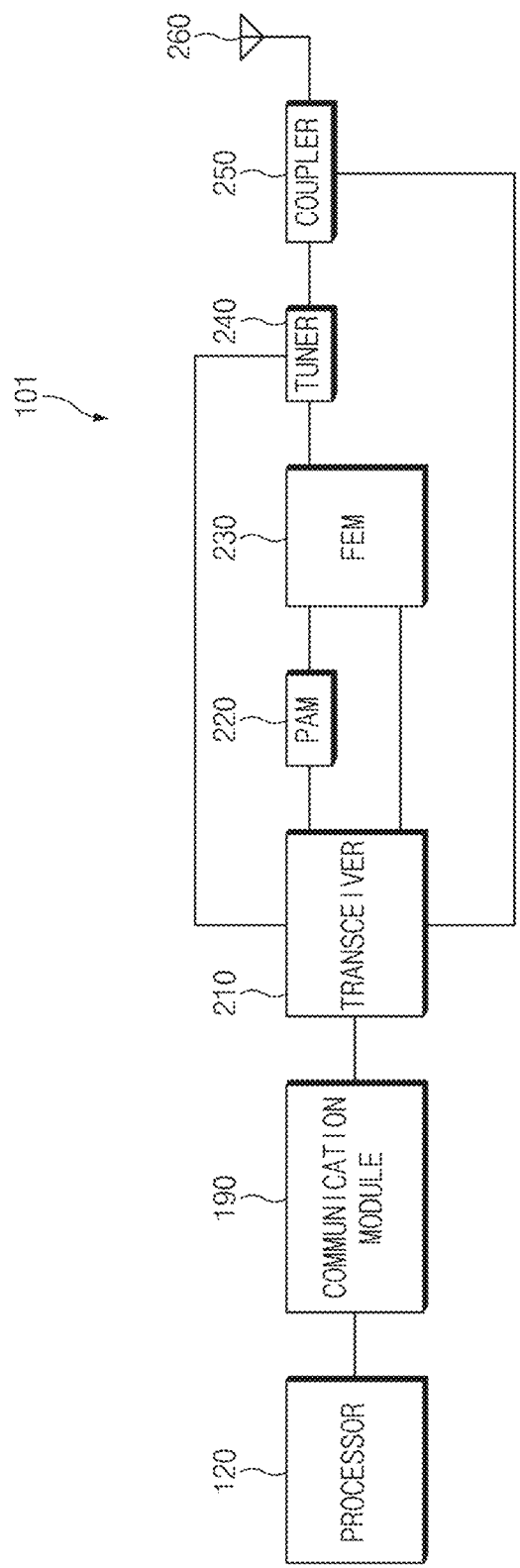
FIGS. 2A, 2B, 3A, and 3B are block diagrams illustrating communication paths of an electronic device according to various embodiments of the disclosure.
Figure 2B:
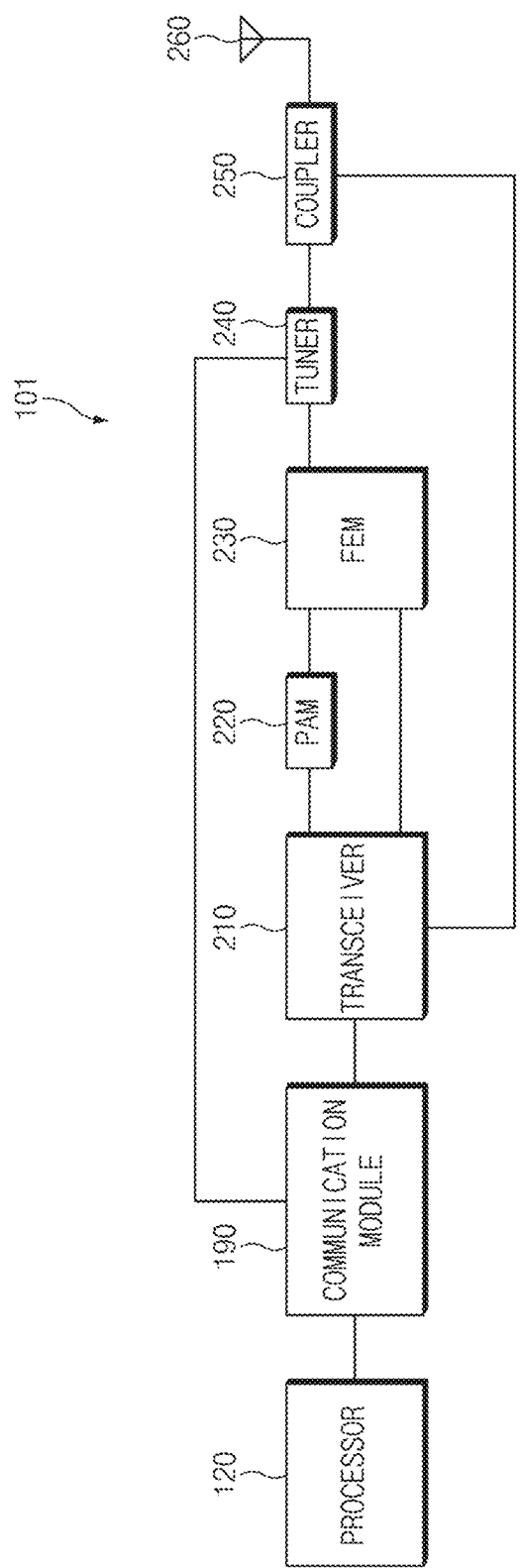

In an embodiment, the FEM 230 may be connected with the tuner 240 as illustrated in FIGS. 2A and 2B. In this case, the FEM 230 may be supplied with an RF signal targeted for transmission or reception by adjusting a resonance frequency of the antenna 260 by using an impedance matching principle at the tuner 240.

Figure 3A:
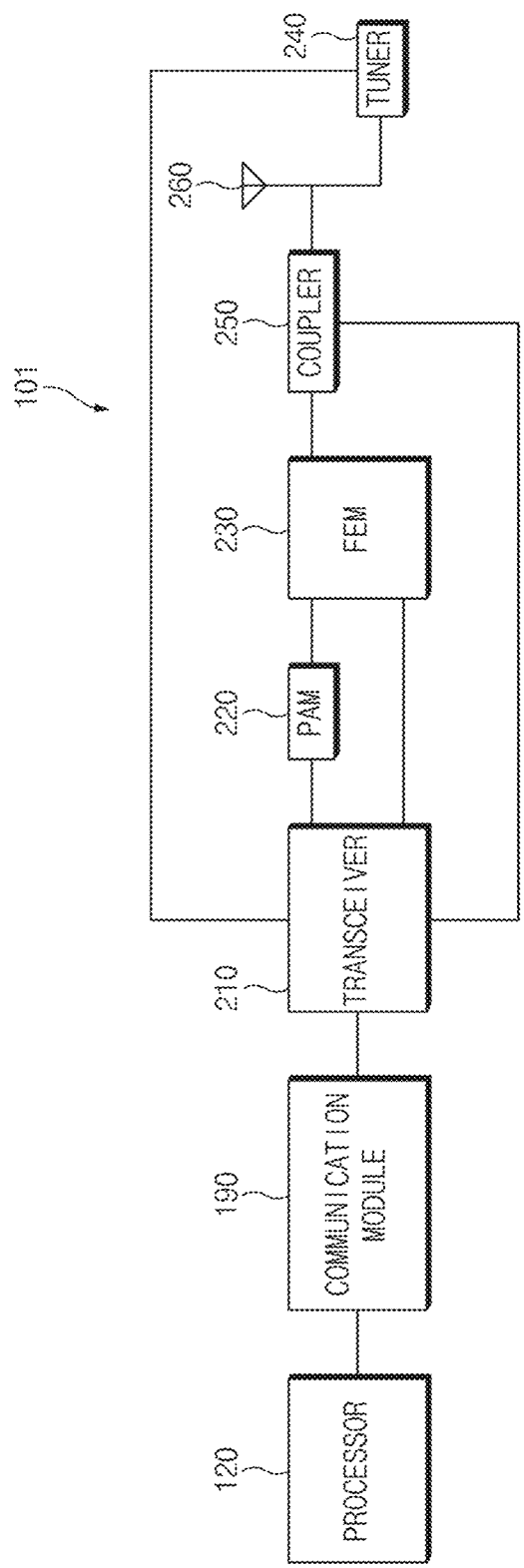
Figure 3B:
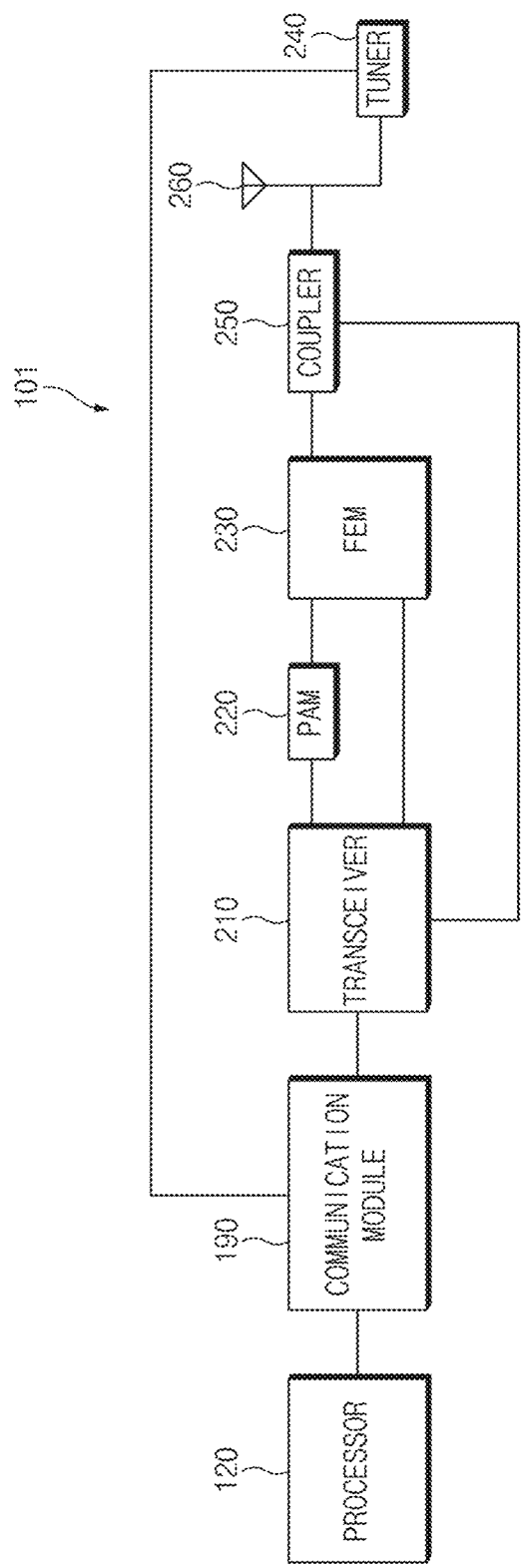

In another embodiment, the FEM 230 may be connected with the coupler 250 as illustrated in FIGS. 3A and 3B. In this case, the FEM 230 may be supplied with an RF signal targeted for transmission or reception by adjusting the resonance frequency of the antenna 260 by using aperture tuning for adjusting an electrical length at the tuner 240.

In an embodiment, the tuner 240 may be connected with the transceiver 210 and the coupler 250 as illustrated in FIGS. 2A and 3A or may be connected with the communication module 190 and the coupler 250 as illustrated in FIGS. 2B and 3B. The tuner 240 may perform a control operation by using the communication module 190 or the transceiver 210. The tuner 240 may allow the transceiver 210 to receive an RF signal better by adjusting a resonance frequency of the antenna 260 or adjusting matching of a circuit included in the coupler 250, so as to correspond to a frequency of an RF signal supplied from the coupler 250. Also, the tuner 240 may allow an RF signal to be transmitted through the antenna 260 better by adjusting the resonance frequency of the antenna 260 or adjusting matching of a circuit included in the coupler 250, so as to correspond to a frequency of an RF signal supplied from the transceiver 210. The tuner 240 may include a variable capacitor for adjusting the resonance frequency of the antenna 260.

In an embodiment, the tuner 240 may be connected with the FEM 230 as illustrated in FIGS. 2A and 2B. In this case, the tuner 240 may allow an RF signal to be supplied to the transceiver 210 better or an RF signal to be received from the transceiver 210 better, by adjusting the resonance frequency of the antenna 260 so as to correspond to a frequency of an RF signal supplied from the coupler 250.

In another embodiment, the tuner 240 may be connected with the antenna 260 as illustrated in FIGS. 3A and 3B. In this case, the tuner 240 may adjust the resonance frequency of the antenna 260 so as to correspond to a frequency of an RF signal to be supplied to the antenna 260, and thus, the RF signal may be provided to the transceiver 210 better or may be received from the transceiver 210 better.

In an embodiment, the coupler 250 may be connected with the transceiver 210, the tuner 240, and the antenna 260. The coupler 250 may match the tuner 240 with the antenna 260 such that an RF signal is easily transmitted/received and may transfer the RF signal to the transceiver 210.

In an embodiment, the coupler 250 may interconnect the tuner 240 and the antenna 260 as illustrated in FIGS. 2A and 2B. In this case, the tuner 240 may be supplied with an RF signal coupled by using the coupler 250 from the antenna 260.

In another embodiment, the coupler 250 may be connected with the FEM 230 as illustrated in FIGS. 3A and 3B. In this case, the tuner 240 may be connected in parallel between the antenna 260 and the coupler 250 and may adjust an electrical distance between the antenna 260 and the coupler 250.

Figure 4:
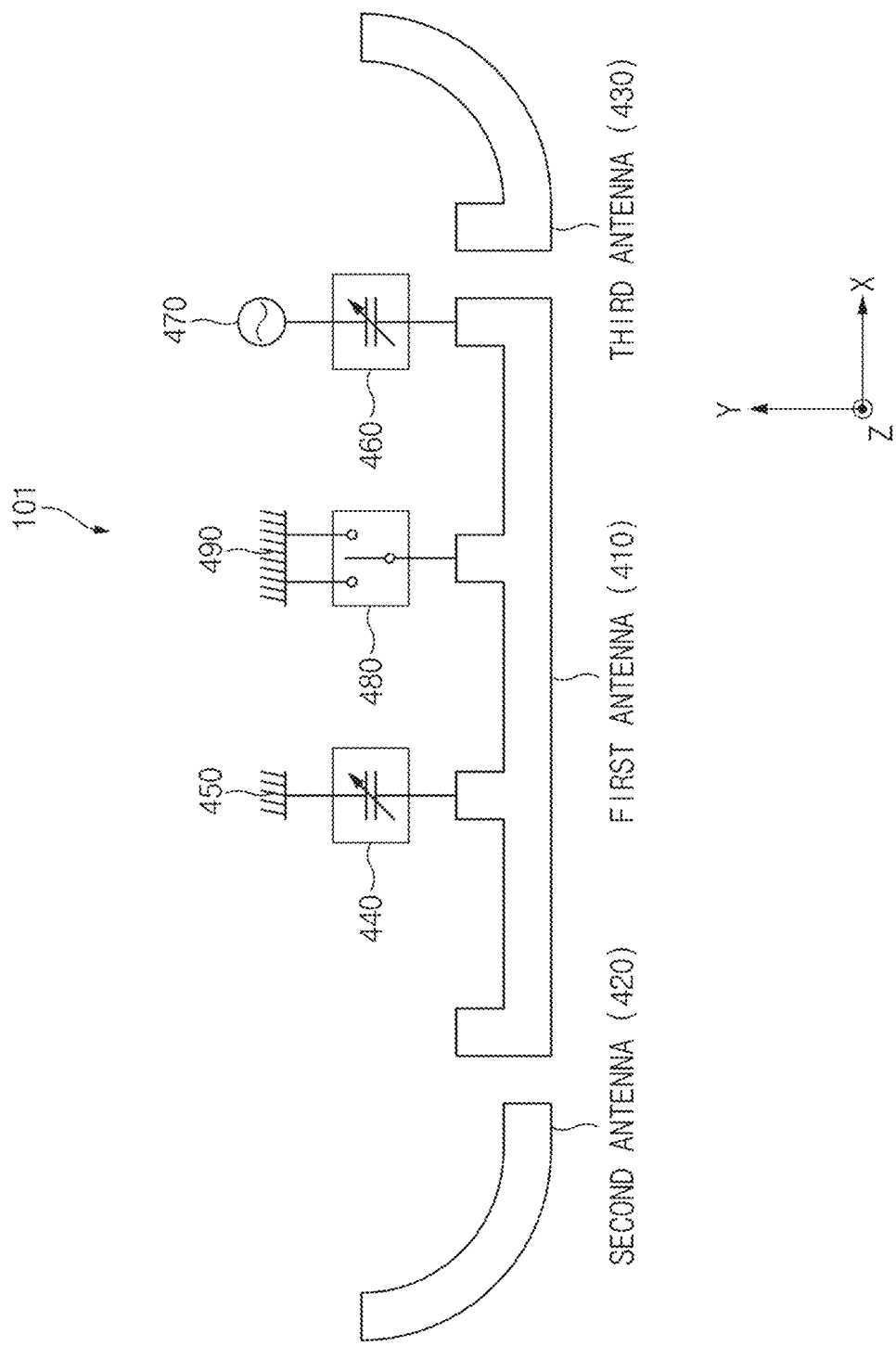
FIG. 4 is a diagram illustrating an antenna and tuners of an electronic device according to an embodiment of the disclosure.

FIG. 4 is a diagram illustrating an antenna (410, 420, 430) and tuners 440 and 460 of the electronic device 101 according to an embodiment of the disclosure.

Referring to FIG. 4, the antenna (410, 420, 430) may be divided into a plurality of portions and may be positioned on at least one side of the electronic device 101. For example, the antenna (410, 420, 430) may be positioned along an edge of the electronic device 101. The antenna (410, 420, 430) may include first, second, and third antennas 410, 420, and 430 that are separated from each other. The antenna (410, 420, 430) may radiate an RF signal from the edge of the electronic device 101. The electronic device 101 may receive an RF signal by using the antenna (410, 420, 430). The first antenna 410 may be connected with the tuners 440 and 460. The second and third antennas 420 and 430 may be directly connected with a coupler (e.g., the coupler 250 of FIG. 2A or FIG. 2B) through a wire.

In an embodiment, the tuners 440 and 460 may be supplied with an RF signal received by the first antenna 410. The tuners 440 and 460 may adjust a resonance frequency of the first antenna 410. The tuners 440 and 460 may include a variable capacitor for adjusting the resonance frequency of the first antenna 410. In the case of adjusting the resonance frequency of the first antenna 410, the first antenna 410 may receive an RF signal. The tuners 440 and 460 may transfer the RF signal received by the first antenna 410 to a ground part 450 or a feeding circuit 470. The ground part 450 or the feeding circuit 470 may be connected with a communication module (e.g., the communication module 190 of FIG. 1).

In an embodiment, the tuner 440 connected with the ground part 450 may adjust an impedance between the first antenna 410 and the ground part 450 such that the resonance frequency of the first antenna 410 is adjusted.

In an embodiment, the tuner 460 connected with the feeding circuit 470 may adjust an impedance between the first antenna 410 and the feeding circuit 470 such that the resonance frequency of the first antenna 410 is adjusted. The tuner 460 connected with the feeding circuit 470 may supply an RF signal to the communication module.

In an embodiment, the first antenna 410 may be connected with a switch 480. The switch 480 may be connected with a ground 490. The switch 480 may selectively connect the first antenna 410 with the ground 490.

Figure 5A:
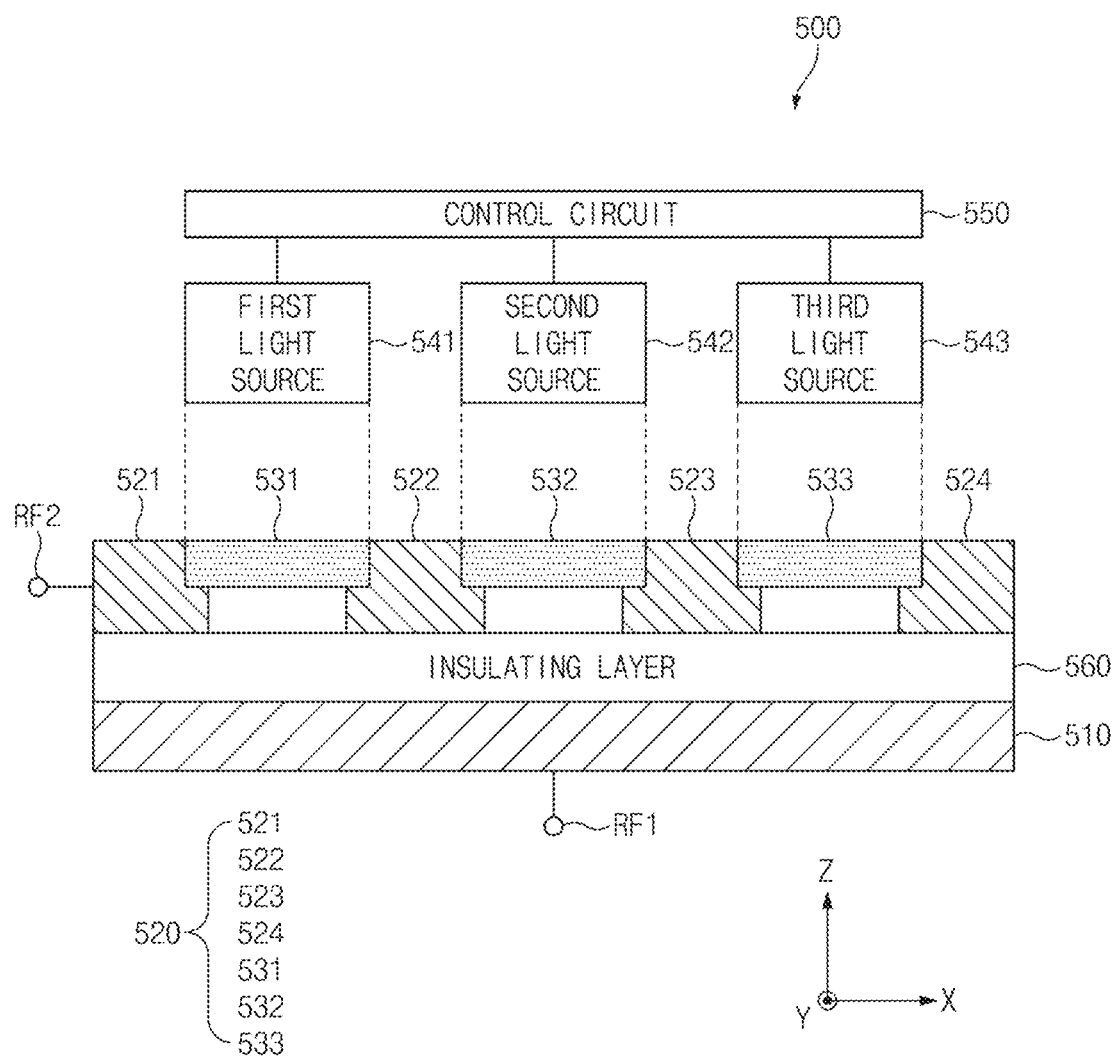
FIG. 5A is a diagram illustrating a capacitor device according to an embodiment of the disclosure.

FIG. 5A is a diagram illustrating a capacitor device 500 according to an embodiment of the disclosure.

Referring to FIG. 5A, the capacitor device 500 may include a first conductive layer 510, a second conductive layer 520, one or more photo-conductive members 531, 532, and 533, one or more light sources 541, 542, and 543, a control circuit 550, and an insulating layer 560.

In an embodiment, the first conductive layer 510 may be formed on a first surface of the capacitor device 500. For example, the first conductive layer 510 may be formed on a lower surface of the capacitor device 500 with respect to a Z-axis. The first conductive layer 510 may form a first electrode of the capacitor device 500. The first conductive layer 510 may be connected with a first RF signal terminal RF1 or a ground of an electronic device (e.g., the electronic device 101 of FIG. 1). The first RF signal terminal RF1 may be connected with internal components of the electronic device 101. For example, in the case where the capacitor device 500 is included in a tuner (e.g., the tuner 240 of FIG. 3A) of the electronic device 101, the first RF signal terminal RF1 may be connected with an antenna (e.g., the antenna 260 of FIG. 3A) of the electronic device 101. The first conductive layer 510 may be implemented with a metal plate or a wiring layer of a printed circuit board (PCB) on which the capacitor device 500 is mounted.

In an embodiment, the second conductive layer 520 may be formed on a second surface of the capacitor device 500. For example, the second conductive layer 520 may be formed on an upper surface of the capacitor device 500 with respect to the Z-axis. The second conductive layer 520 may form a second electrode of the capacitor device 500. The second conductive layer 520 may be connected with a second RF signal terminal RF2 or the ground of the electronic device 101. The second RF signal terminal RF2 may be connected with internal components of an electronic device (e.g., the electronic device 101 of FIG. 1). For example, in the case where the capacitor device 500 is included in a tuner (e.g., the tuner 240 of FIG. 3A) of the electronic device 101, the second RF signal terminal RF2 may be connected with an FEM (e.g., the FEM 230 of FIG. 3A) of the electronic device 101.

In an embodiment, the second conductive layer 520 may be positioned to be opposite to the first conductive layer 510. The second conductive layer 520 may be spaced from the first conductive layer 510 as much as a given distance. The second conductive layer 520 may include a plurality of conductors 521, 522, 523, and 524 and the one or more photo-conductive members 531, 532, and 533. The second RF signal terminal RF2 may be connected to any one conductor 521.

In an embodiment, the plurality of conductors 521, 522, 523, and 524 may be positioned within the second conductive layer 520. The plurality of conductors 521, 522, 523, and 524 may be spaced from each other. The plurality of conductors 521, 522, 523, and 524 may be implemented with a metal pattern or a wiring pattern of the PCB on which the capacitor device 500 is mounted.

In an embodiment, the one or more photo-conductive members 531, 532, and 533 may be positioned within the second conductive layer 520. The one or more photo-conductive members 531, 532, and 533 may be positioned between the plurality of conductors 521, 522, 523, and 524. For example, in the case where the four conductors 521, 522, 523, and 524 are arranged to be spaced from each other in an x-axis direction, the three photo-conductive members 531, 532, and 533 may be positioned between the conductors 521, 522, 523, and 524. A thickness of the one or more photo-conductive members 531, 532, and 533 may be smaller than a thickness of the plurality of conductors 521, 522, 523, and 524. As such, the one or more photo-conductive members 531, 532, and 533 may be spaced from the insulating layer 560. However, the disclosure is not limited thereto. For example, the thickness of the one or more photo-conductive members 531, 532, and 533 may be identical to the thickness of the plurality of conductors 521, 522, 523, and 524. Also, the one or more photo-conductive members 531, 532, and 533 may be positioned to be in contact with one surface of the insulating layer 560.

In an embodiment, as the intensity of light incident on the one or more photo-conductive members 531, 532, and 533 increases, the conductivity of the one or more photo-conductive members 531, 532, and 533 may increase. When a light is not incident, the one or more photo-conductive members 531, 532, and 533 may have a characteristic of a nonconductor. When the one or more photo-conductive members 531, 532, and 533 are exposed to a light, the one or more photo-conductive members 531, 532, and 533 may react to the light and may be converted into a conductive material. The electric conductivity of the one or more photo-conductive members 531, 532, and 533 may increase in proportion to the intensity of light until the one or more photo-conductive members 531, 532, and 533 reach the maximum electric conductivity.

In an embodiment, the one or more light sources 541, 542, and 543 may be positioned on one surface of the second conductive layer 520. For example, the one or more light sources 541, 542, and 543 may be positioned above the second conductive layer 520 with respect to the Z-axis. For example, as illustrated in FIG. 5A, the one or more light sources 541, 542, and 543 may be spaced from the second conductive layer 520. For another example, the one or more light sources 541, 542, and 543 may be in contact with one surface of the second conductive layer 520.

In an embodiment, the one or more light sources 541, 542, and 543 may be positioned at locations corresponding to the one or more photo-conductive members 531, 532, and 533. For example, in the case where three photo-conductive members 531, 532, and 533 are positioned, the first to third light sources 541 to 543 may be positioned at locations respectively corresponding to the photo-conductive members 531, 532, and 533 with respect to the Z-axis. The one or more light sources 541, 542, and 543 may be mounted within the PCB. The one or more light sources 541, 542, and 543 may be a mini light-emitting diode (LED), a micro LED, a quantum dot element, or a semiconductor element having a luminescence characteristic.

In an embodiment, the control circuit 550 may be connected with the one or more light sources 541, 542, and 543. The control circuit 550 may selectively turn on or turn off the one or more light sources 541, 542, and 543. The control circuit 550 may control the one or more light sources 541, 542, and 543 under control of a processor (e.g., the processor 120 of FIG. 1) or a communication module (e.g., the communication module 190 of FIG. 1).

In an embodiment, the insulating layer 560 may be interposed between the first conductive layer 510 and the second conductive layer 520. The insulating layer 560 may electrically separate the first conductive layer 510 and the second conductive layer 520. The insulating layer 560 may have a capacitance that is formed between the first conductive layer 510 and the second conductive layer 520 forming electrodes of the capacitor device 500. The insulating layer 560 may be formed of a dielectric material having a specified dielectric coefficient.

The capacitor device 500 according to an embodiment may include one or more light sources 541, 542, and 543, a control circuit 550 that controls the one or more light sources 541, 542, and 543, a first conductive layer 510, a second conductive layer 520 that is formed to be opposite to the first conductive layer 510 and includes a plurality of conductors 521, 522, 523, and 524 electrically separated, and one or more photo-conductive members 531, 532, and 533 positioned to correspond to the one or more light sources 541, 542, and 543 in a state where the one or more photo-conductive members 531, 532, and 533 are connected between the plurality of conductors 521, 522, 523, and 524, and an insulating layer 560 that is interposed between the first conductive layer 510 and the second conductive layer 520.

In an embodiment, the one or more light sources 541, 542, and 543 may be spaced from each other at a specified interval and may output a light to one surface of the second conductive layer 520, and the one surface may be opposite to another surface of the second conductive layer 520, which is in contact with the insulating layer 560.

In an embodiment, the plurality of conductors 521, 522, 523, and 524 may be in contact with the insulating layer 560, and the one or more photo-conductive members 531, 532, and 533 may be spaced from the insulating layer 560 as much as a specified distance.

In an embodiment, the control circuit 550 may control whether to turn on or turn off each of the one or more light sources 541, 542, and 543 and an intensity of light to be output.

In an embodiment, the one or more photo-conductive members 531, 532, and 533 may receive lights that the one or more light sources 541, 542, and 543 output to electrically connect the plurality of conductors 521, 522, 523, and 524.

In an embodiment, the control circuit 550 may increase a capacitance value between the first conductive layer 510 and the second conductive layer 520 by increasing a number of light sources turned on from among the one or more light sources 541, 542, and 543 or an intensity of light to be output from each of the one or more light sources 541, 542, and 543.

Figure 5B:
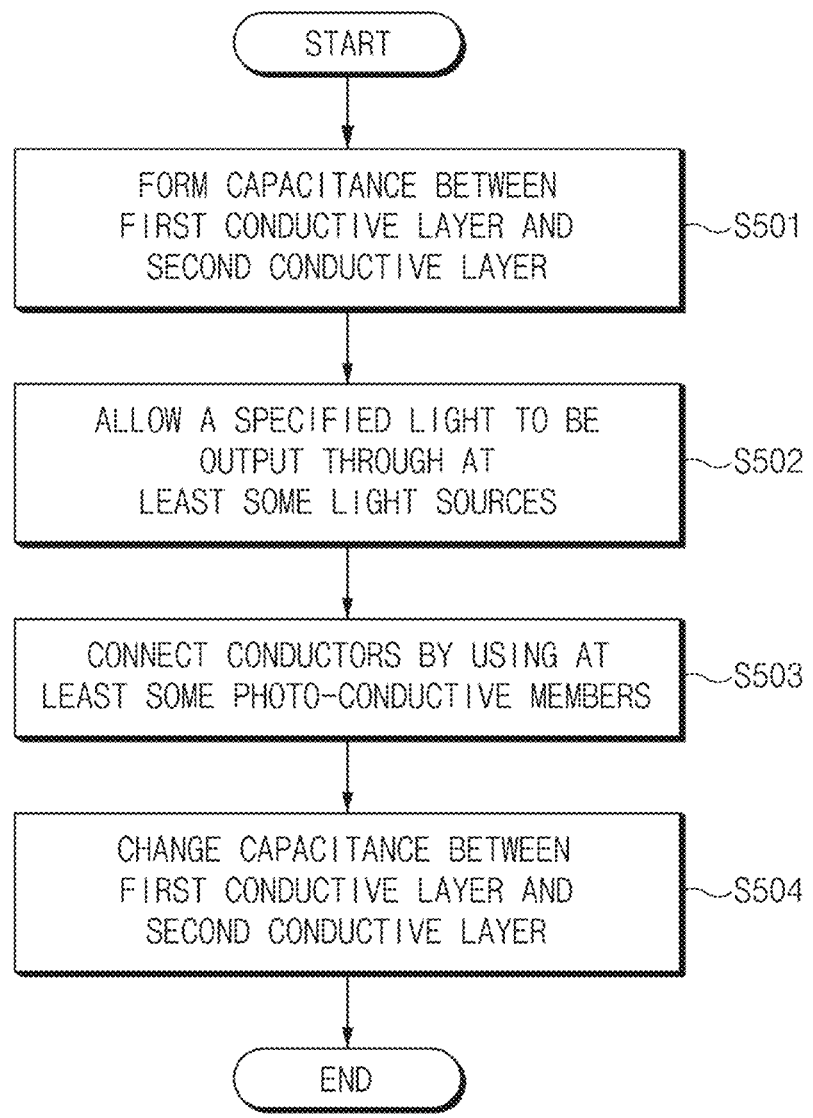
FIG. 5B is a flowchart illustrating a schematic operation of a control circuit of a capacitor device according to an embodiment of the disclosure.

FIG. 5B is a flowchart illustrating a schematic operation of the control circuit 550 of the capacitor device 500 according to an embodiment of the disclosure.

Referring to FIG. 5B, in operation 5501, the control circuit 550 of the capacitor device 500 according to an embodiment may form a capacitance between the first conductive layer 510 and the second conductive layer 520.

In operation 5502, the control circuit 550 of the capacitor device 500 according to an embodiment may be configured to output a specified light through at least a part of the one or more light sources 541, 542, and 543.

In operation 5503, the control circuit 550 of the capacitor device 500 according to an embodiment may electrically connect at least some of the plurality of conductors 521, 522, 523, and 524 by using at least a part of the one or more photo-conductive members 531, 532, and 533.

In operation 5504, the control circuit 550 of the capacitor device 500 according to an embodiment may change the capacitance between the first conductive layer 510 and the second conductive layer 520.

FIGS. 6A to 6D are diagrams illustrating how the capacitor device 500 according to various embodiments of the disclosure.

Figure 6A:
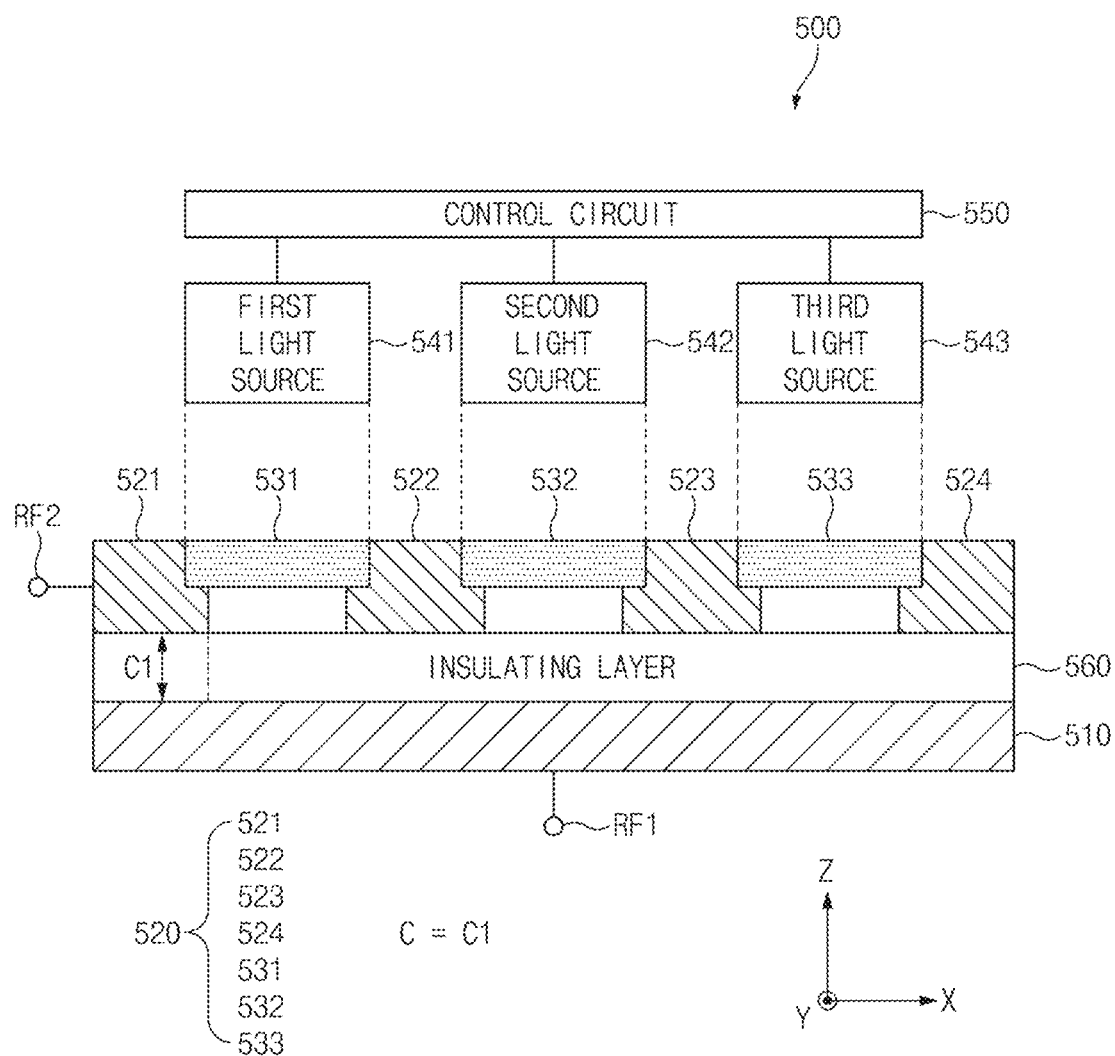
FIGS. 6A, 6B, 6C, and 6D are diagrams illustrating how a capacitor device according to various embodiments of the disclosure.

Referring to FIG. 6A, when all the first, second, and third light sources 541, 542, and 543 are turned off, all the one or more photo-conductive members 531, 532, and 533 positioned at locations corresponding to the first to third light sources 541 to 543 may have a characteristic of a nonconductor. As such, the plurality of conductors 521, 522, 523, and 524 included in the second conductive layer 520 may be electrically separated from each other.

In an embodiment, the second RF signal terminal RF2 may be connected to the first conductor 521 included in the second conductive layer 520. As illustrated in FIG. 6A, when the first conductor 521 is electrically separated from the remaining conductors 522, 523, and 524, an electrical signal from the second RF signal terminal RF2 may be supplied only to the first conductor 521. For example, a capacitance "C" formed between the first conductive layer 510 and the second conductive layer 520 may be identical to a first capacitance C1 being a capacitance formed between the first conductive layer 510 and the first conductor 521 (C=C1).

Figure 6B:
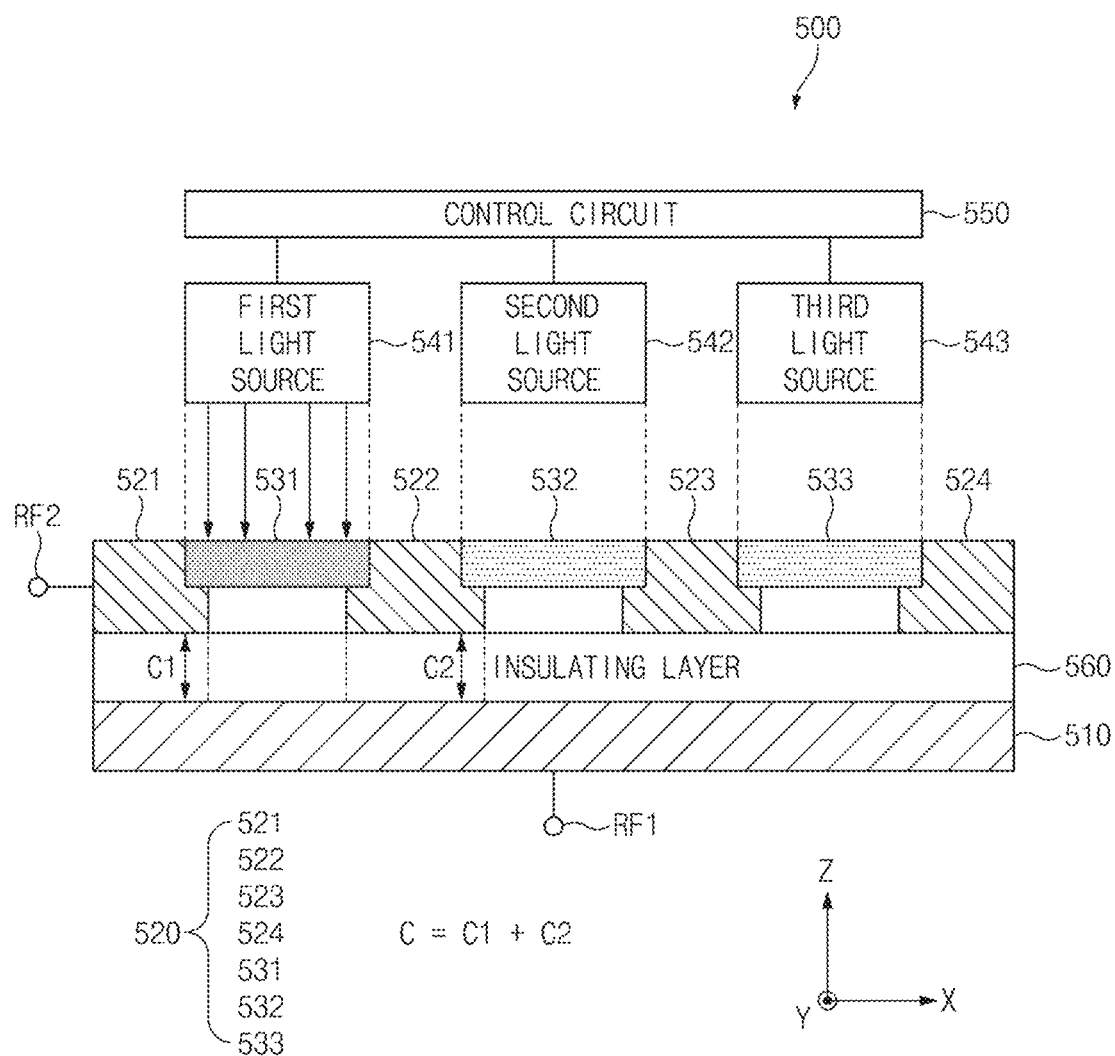

Referring to FIG. 6B, when the first light source 541 is turned on and the second and third light sources 542 and 543 are turned off, the first photo-conductive member 531 positioned at a location corresponding to the first light source 541 may be converted into a conductive material, and the second and third photo-conductive members 532 and 533 positioned at locations respectively corresponding to the second and third light sources 542 and 543 may have a characteristic of a nonconductor. As such, the first and second conductors 521 and 522 of the second conductive layer 520 may be electrically connected, and the third and fourth conductors 523 and 524 may be electrically separated.

In an embodiment, the second RF signal terminal RF2 may be connected to the first conductor 521 included in the second conductive layer 520. As illustrated in FIG. 6B, when the first conductor 521 is electrically connected with the second conductor 522, an electrical signal from the second RF signal terminal RF2 may be supplied to the first and second conductors 521 and 522. For example, the capacitance "C" formed between the first conductive layer 510 and the second conductive layer 520 may be identical to a sum of the first capacitance C1 and a second capacitance C2 being a capacitance formed between the first conductive layer 510 and the second conductor 522 (C=C1+C2). This may correspond to a minimum capacitance formed between the first and second conductors 510 and 520.

Figure 6C:
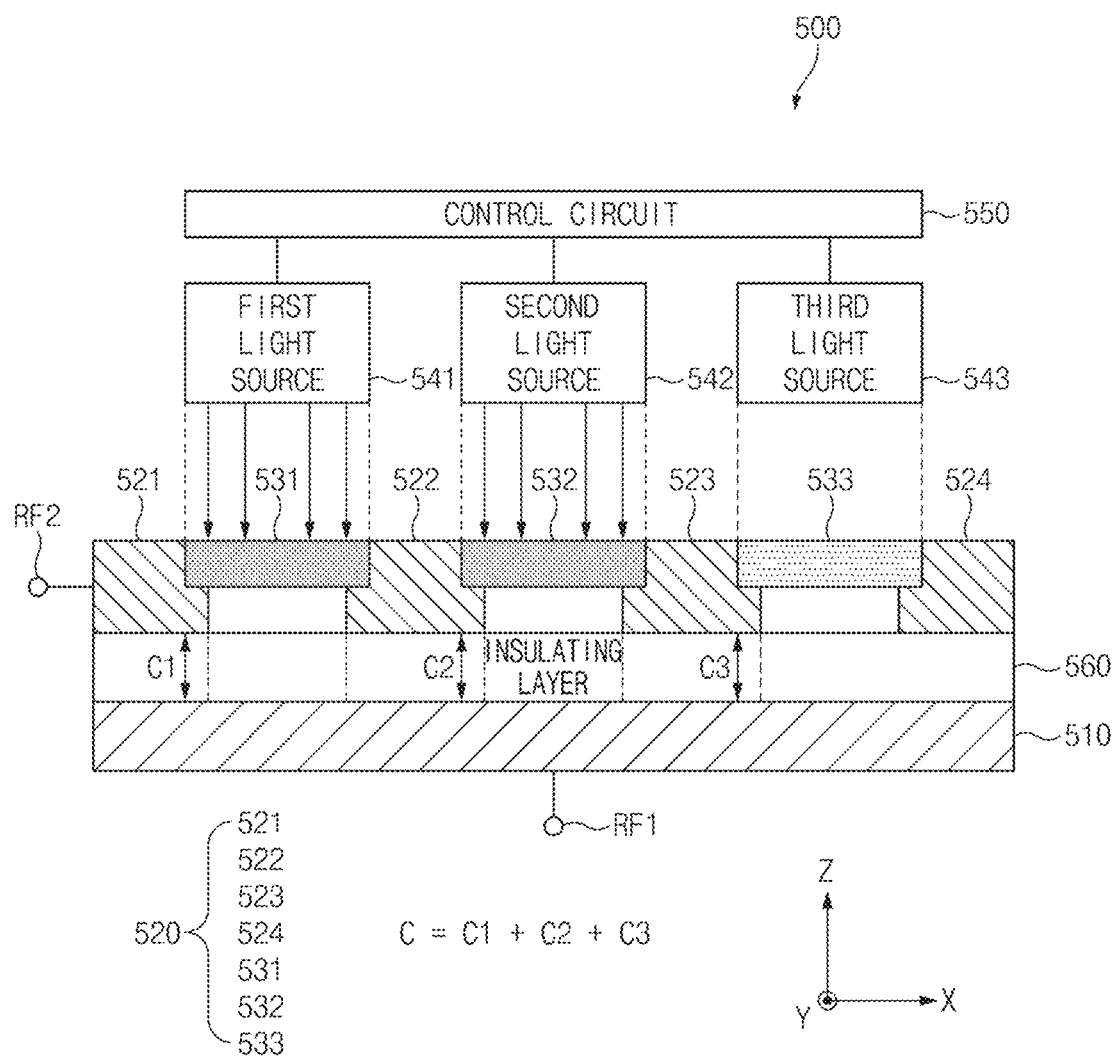

In an embodiment, as illustrated in FIG. 6C, when the first and second light sources 541 and 542 are turned on and the third light source 543 is turned off, the first and second photo-conductive members 531 and 532 respectively positioned at the locations corresponding to the first and second light sources 541 and 542 may be converted into a conductive material, and the third photo-conductive member 533 positioned at the location corresponding to the third light source 543 may have a characteristic of a nonconductor. As such, the first to third conductors 521 to 523 of the second conductive layer 520 may be electrically connected, and the fourth conductor 524 may be electrically separated therefrom.

Referring to FIG. 6C, the second RF signal terminal RF2 may be connected to the first conductor 521 included in the second conductive layer 520. As illustrated in FIG. 6C, when the first conductor 521 is electrically connected with the second and third conductors 522 and 523, an electrical signal from the second RF signal terminal RF2 may be supplied to the first to third conductors 521 to 523. For example, the capacitance "C" formed between the first conductive layer 510 and the second conductive layer 520 may be identical to a sum of the first capacitance C1, the second capacitance C2, and a third capacitance C3 being a capacitance formed between the first conductive layer 510 and the third conductor 523 (C=C1+C2+C3).

Figure 6D:
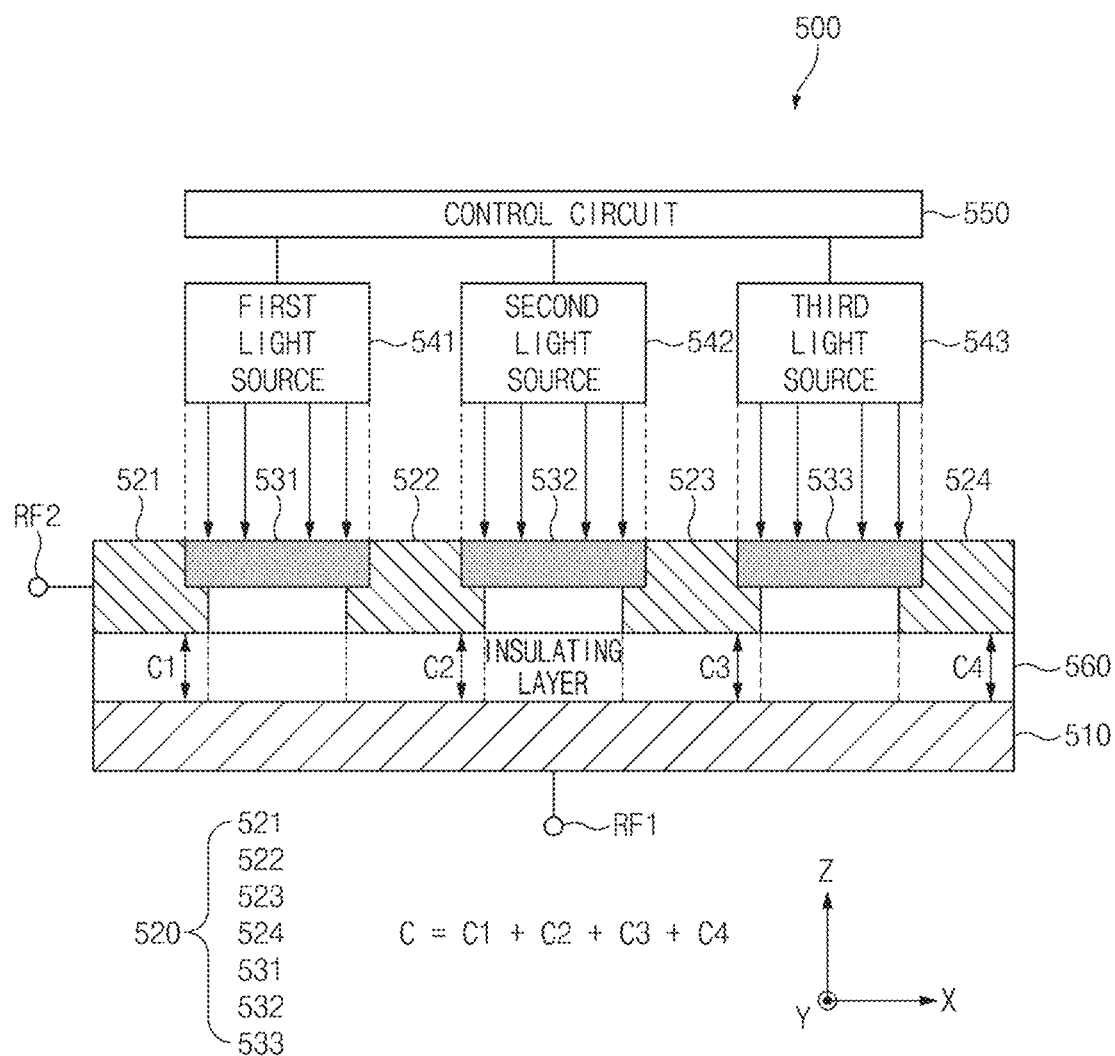

Referring to FIG. 6D, when all the first to third light sources 541 to 543 are turned on, the first to third photo-conductive members 531 to 533 positioned at the locations respectively corresponding to the first to third light sources 541 to 543 may be converted into a conductive material. As such, the first to fourth conductors 521 to 524 of the second conductive layer 520 may be electrically connected.

In an embodiment, the second RF signal terminal RF2 may be connected to the first conductor 521 included in the second conductive layer 520. As illustrated in FIG. 6D, when the first conductor 521 is electrically connected with the second to fourth conductors 522 to 524, an electrical signal from the second RF signal terminal RF2 may be supplied to the first to fourth conductors 521 to 524. For example, the capacitance "C" formed between the first conductive layer 510 and the second conductive layer 520 may be identical to a sum of the first capacitance C1, the second capacitance C2, the third capacitance C3, and a fourth capacitance C4 being a capacitance formed between the first conductive layer 510 and the fourth conductor 524 (C=C1+C2+C3+C4). This may correspond to a maximum capacitance formed between the first and second conductors 510 and 520.

An electronic device (e.g., the electronic device 101 of FIG. 1) according to an embodiment may include a first conductive layer 510, a second conductive layer 520 that is formed to be opposite to the first conductive layer 510, and includes a plurality of conductors 521 to 524 electrically separated, and one or more photo-conductive members 531 to 533 positioned to be connected between the plurality of conductors 521 to 524, an insulating layer 560 that is interposed between the first conductive layer 510 and the second conductive layer 520, one or more light sources 541 to 543 that are positioned to face the one or more photo-conductive members 531 to 533, and a control circuit 550. The control circuit 550 may output a specified light through at least one light source of the one or more light sources 541 to 543 such that at least one photo-conductive member converted into a conductive material in response to the light from among the one or more photo-conductive members 531 to 533 and at least some conductors electrically connected with the at least one photo-conductive member from among the plurality of conductors 521 to 524 are connected and a capacitance value between the first conductive layer 510 and the second conductive layer 520 is changed.

In an embodiment, the plurality of conductors 521 to 524 may be separated from each other and may be in contact with one surface of the insulating layer 560, and the one or more photo-conductive members 531 to 533 may be spaced from the insulating layer 560.

In an embodiment, the first conductive layer 510 may be connected with an antenna (e.g., the antenna 260 of FIG. 3A), and the second conductive layer 520 may be connected with a front end module (FEM) (e.g., the FEM 230 FIG. 3A).

In an embodiment, the control circuit 550 may increase a number of light sources outputting the light from among the one or more light sources 541 to 543 to increase an area of a photo-conductive member converted into a conductive material in response to the light.

In an embodiment, the control circuit 550 may increase a number of light sources outputting the light from among the one or more light sources 541 to 543 to increase a capacitance value between the first conductive layer 510 and the second conductive layer 520.

In an embodiment, the control circuit 550 may increase a number of light sources outputting the light from among the one or more light sources 541 to 543 to increase a number of conductive layers formed on the second conductive layer 520.

Figure 6E:
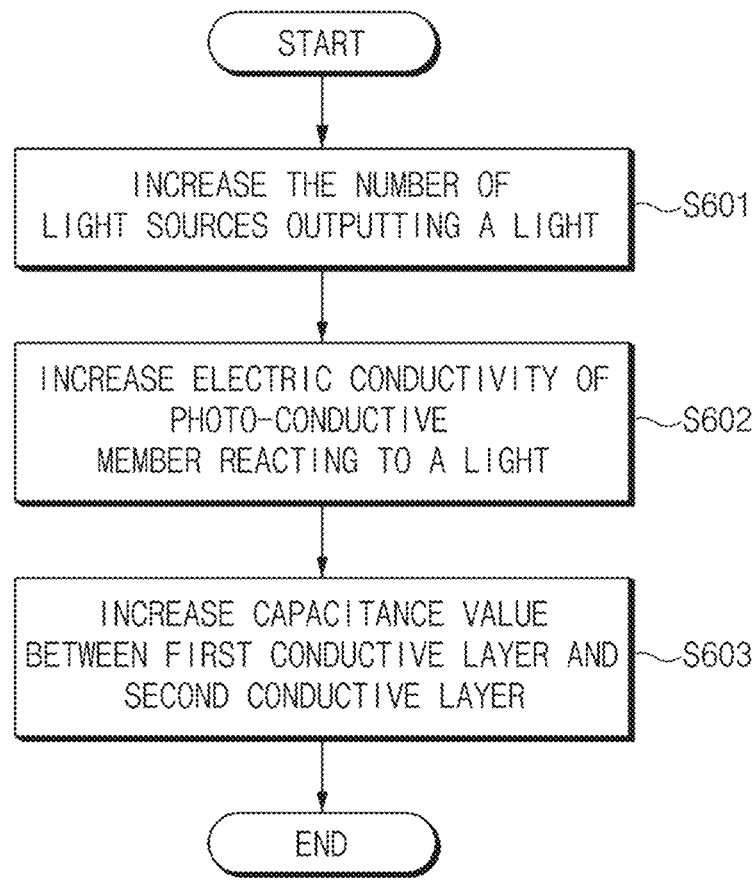
FIG. 6E is a flowchart illustrating a detailed operation of a control circuit of a capacitor device according to an embodiment of the disclosure.

FIG. 6E is a flowchart illustrating a detailed operation of the control circuit 550 of the capacitor device 500 according to an embodiment of the disclosure.

Referring to FIG. 6E, in operation 5601, the control circuit 550 of the capacitor device 500 according to an embodiment may increase the number of light sources outputting a light.

In operation 5602, the control circuit 550 of the capacitor device 500 according to an embodiment may increase the electric conductivity of the photo-conductive members 531, 532, and 533 reacting to a light.

In operation 5603, the control circuit 550 of the capacitor device 500 according to an embodiment may increase a capacitance value between the first conductive layer 510 and the second conductive layer 520.

Figure 7A:
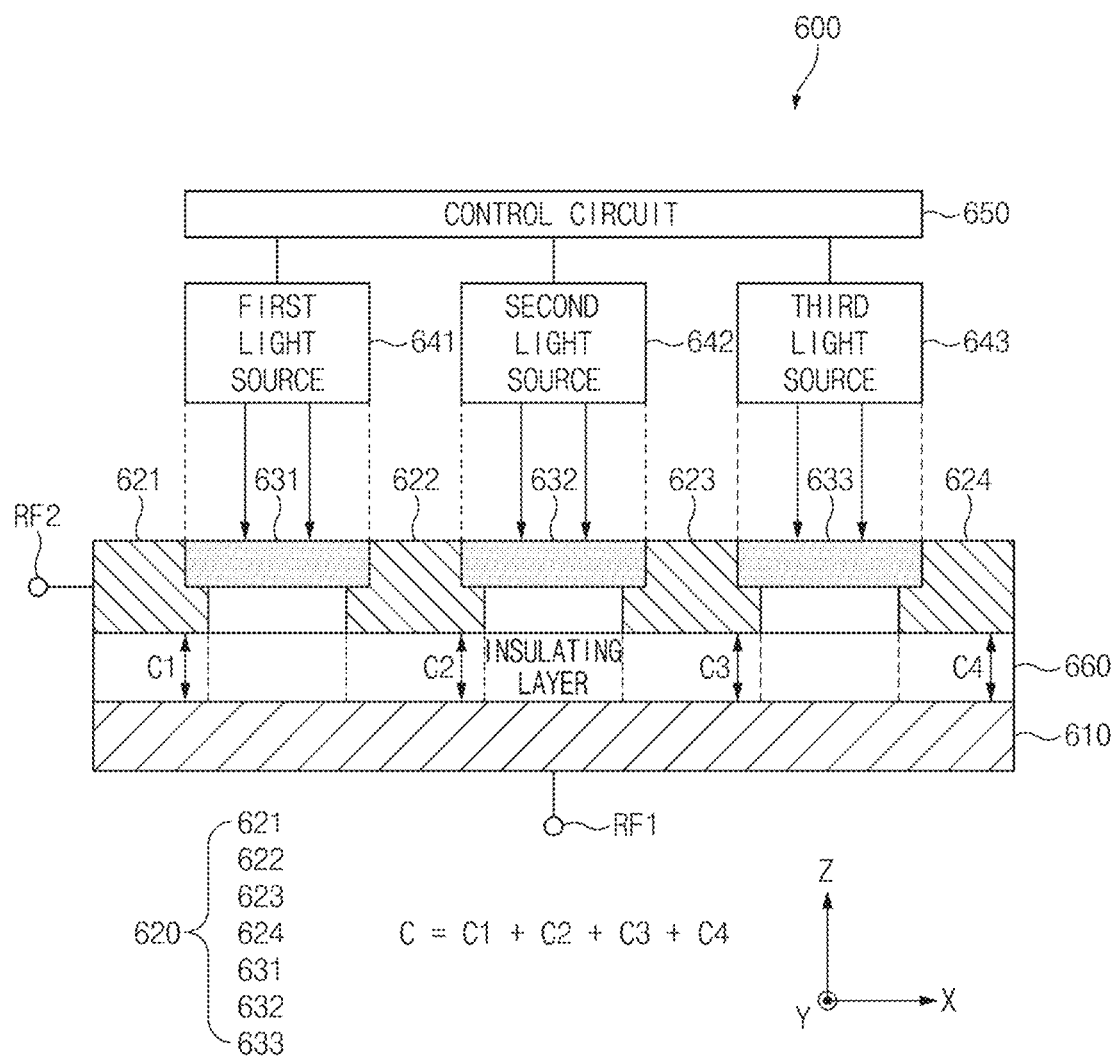
FIGS. 7A and 7B are diagrams illustrating how a capacitor device according to another embodiment is driven.
Figure 7B:
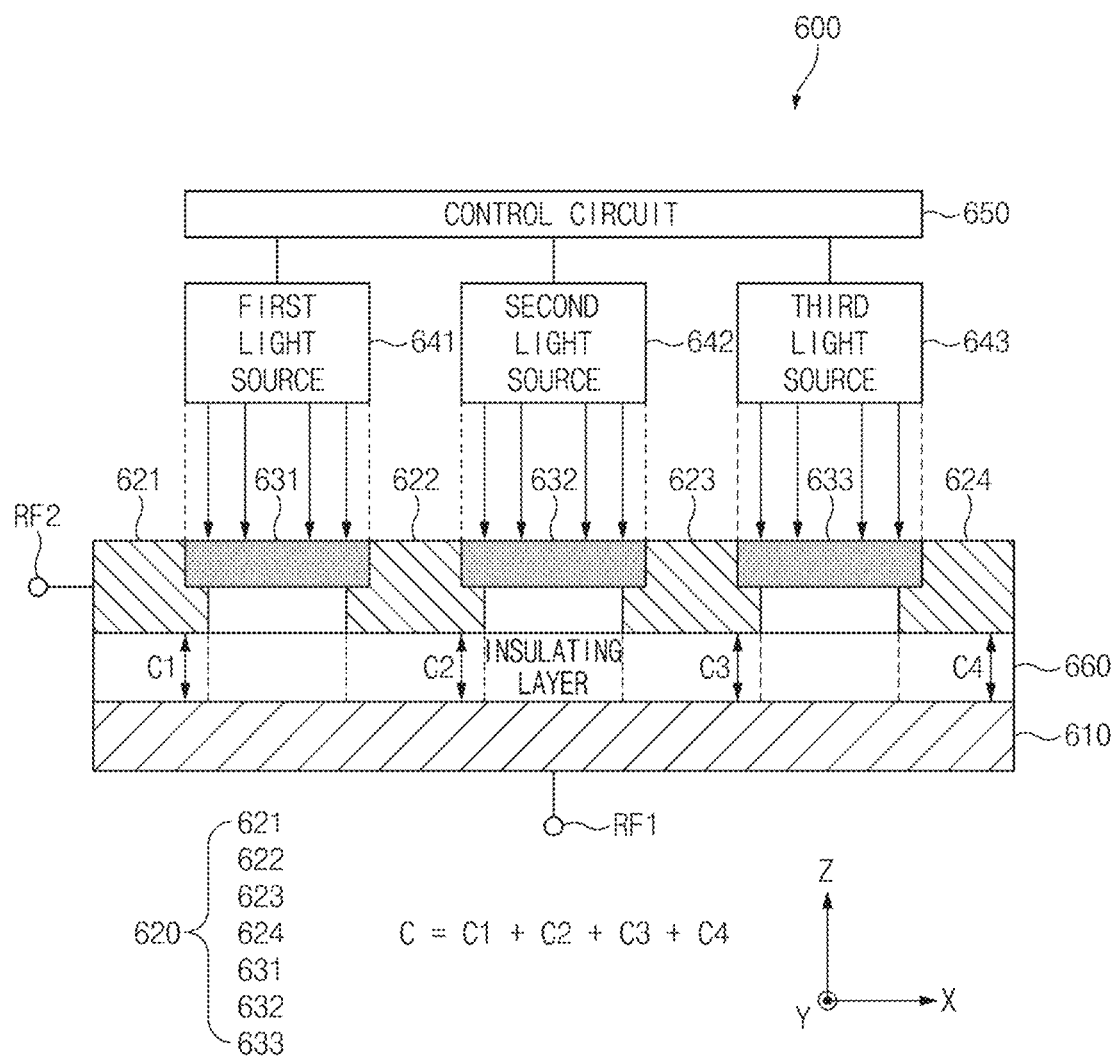

FIGS. 7A and 7B are diagrams illustrating how a capacitor device 600 according to an embodiment is driven.

The capacitor device 600 according to another embodiment may include a first conductive layer 610, a second conductive layer 620, one or more light sources 641, 642, and 643, a control circuit 650, and an insulating layer 660. Functions of the first conductive layer 610, the second conductive layer 620, the one or more light sources 641, 642, and 643, the control circuit 650, and the insulating layer 660 of the capacitor device 600 according to another embodiment are identical to the functions of the first conductive layer 510, the second conductive layer 520, the one or more light sources 541, 542, and 543, the control circuit 550, and the insulating layer 560 of the capacitor device 500 according to an embodiment, and thus, additional description will be omitted to avoid redundancy.

In an embodiment, the one or more light sources 641, 642, and 643 may be spaced from the second conductive layer 620 as much as a specified interval in the Z-axis direction. The one or more light sources 641, 642, and 643 may output a light on a surface of the second conductive layer 620. The one or more light sources 641, 642, and 643 may control the intensity of light to be output. The electric conductivity of the second conductive layer 620 exposed to a light may vary depending on the intensity of light that the one or more light sources 641, 642, and 643 output.

In an embodiment, the control circuit 650 may control the intensity of light that the one or more light sources 641, 642, and 643 output toward the second conductive layer 620. The control circuit 650 may control the intensity of light to be output, depending on the magnitude of a target capacitance to be formed between the first and second conductive layers 610 and 620.

Referring to FIG. 7A, when the intensity of light output from the one or more light sources 641, 642, and 643 is small, the degree to which the at least one or more photo-conductive members 641, 632, and 633 are exposed to the light output from the one or more light sources 641, 642, and 643 may decrease. Because the at least one or more photo-conductive members 641, 632, are 633 are exposed to the light of the small intensity, an increasing rate of the electric conductivity may be small. As such, a plurality of conductors 621, 622, 623, and 624 included in the second conductive layer 620 may be connected by using the photo-conductive members 631, 632, and 633 having the small electric conductivity.

In an embodiment, the second RF signal terminal RF2 may be connected to the first conductor 621 included in the second conductive layer 620. As illustrated in FIG. 7A, when the first conductor 621 is connected with the remaining conductors 622, 623, and 624 by using the photo-conductive members 631, 632, and 633 having the small electric conductivity, a sum of capacitances by the plurality of conductors 621, 622, 623, and 624 may decrease.

Referring to FIG. 7B, when the intensity of light output from the one or more light sources 641, 642, and 643 is great, the degree to which the at least one or more photo-conductive members 641, 632, and 633 are exposed to the light output from the one or more light sources 641, 642, and 643 may increase. Because the at least one or more photo-conductive members 641, 632, and 633 are exposed to the light of the great intensity, an increasing rate of the electric conductivity may be great. As such, the plurality of conductors 621, 622, 623, and 624 included in the second conductive layer 620 may be connected by using the photo-conductive members 631, 632, and 633 having the great electric conductivity.

In an embodiment, the second RF signal terminal RF2 may be connected to the first conductor 621 included in the second conductive layer 620. As illustrated in FIG. 7B, when the first conductor 621 is connected with the remaining conductors 622, 623, and 624 by using the photo-conductive members 631, 632, and 633 having the great electric conductivity, a sum of capacitances by the plurality of conductors 621, 622, 623, and 624 may increase.

The control circuit 650 of the capacitor device 600 according to an embodiment may output a specified light through at least one light source of the one or more light sources 641, 642, and 643 such that at least one photo-conductive member, the electric conductivity of which increases in response to a light, from among the one or more photo-conductive members 631, 632, and 633 and at least some conductors electrically connected with the at least one photo-conductive member from among the plurality of conductors 621, 622, 623, and 624 are connected and a capacitance value between the first conductive layer 610 and the second conductive layer 620 is changed.

In an embodiment, the control circuit 650 may increase an intensity of the light output from the one or more light sources 641, 642, and 643 to increase an electric conductivity of a photo-conductive member reacting to the light.

In an embodiment, the control circuit 650 may increase an intensity of the light output from the one or more light sources 641, 642, and 643 to increase a capacitance value between the first conductive layer 610 and the second conductive layer 620.

Figure 7C:
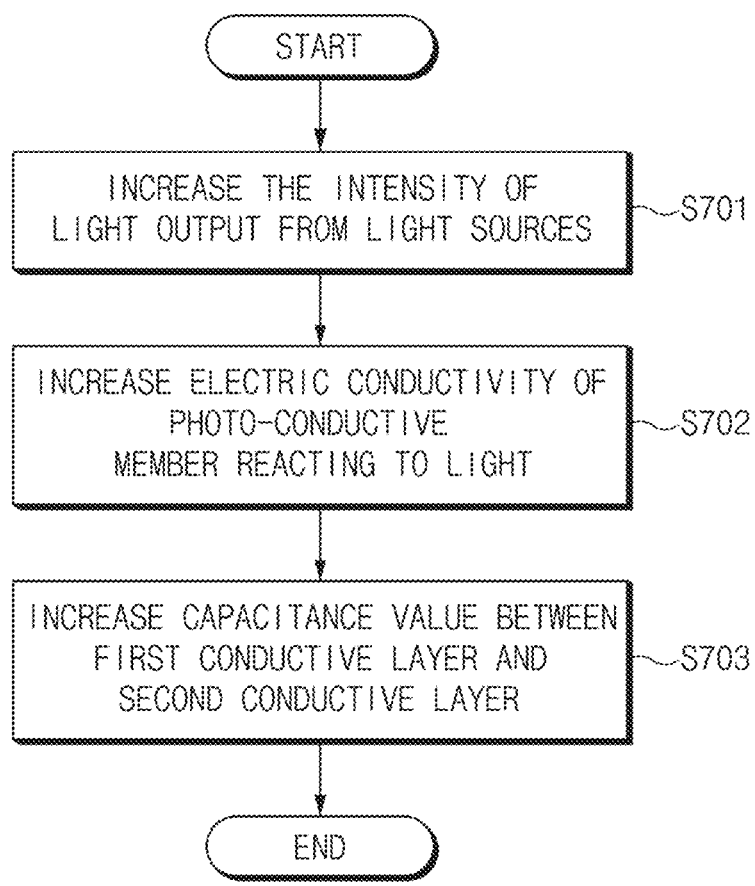
FIG. 7C is a flowchart illustrating a detailed operation of a control circuit of a capacitor device according to an embodiment of the disclosure.

FIG. 7C is a flowchart illustrating a detailed operation of the control circuit 650 of the capacitor device 600 according to an embodiment of the disclosure.

Referring to FIG. 7C, in operation 5701, the control circuit 650 of the capacitor device 600 according to another embodiment may increase the intensity of light output from the one or more light sources 641, 642, and 643.

In operation 5702, the control circuit 650 of the capacitor device 600 according to another embodiment may increase the electric conductivity of the photo-conductive members 631, 632, and 633 reacting to the light.

In operation 5703, the control circuit 650 of the capacitor device 600 according to another embodiment may increase a capacitance value between the first conductive layer 610 and the second conductive layer 620.

Figure 8A:
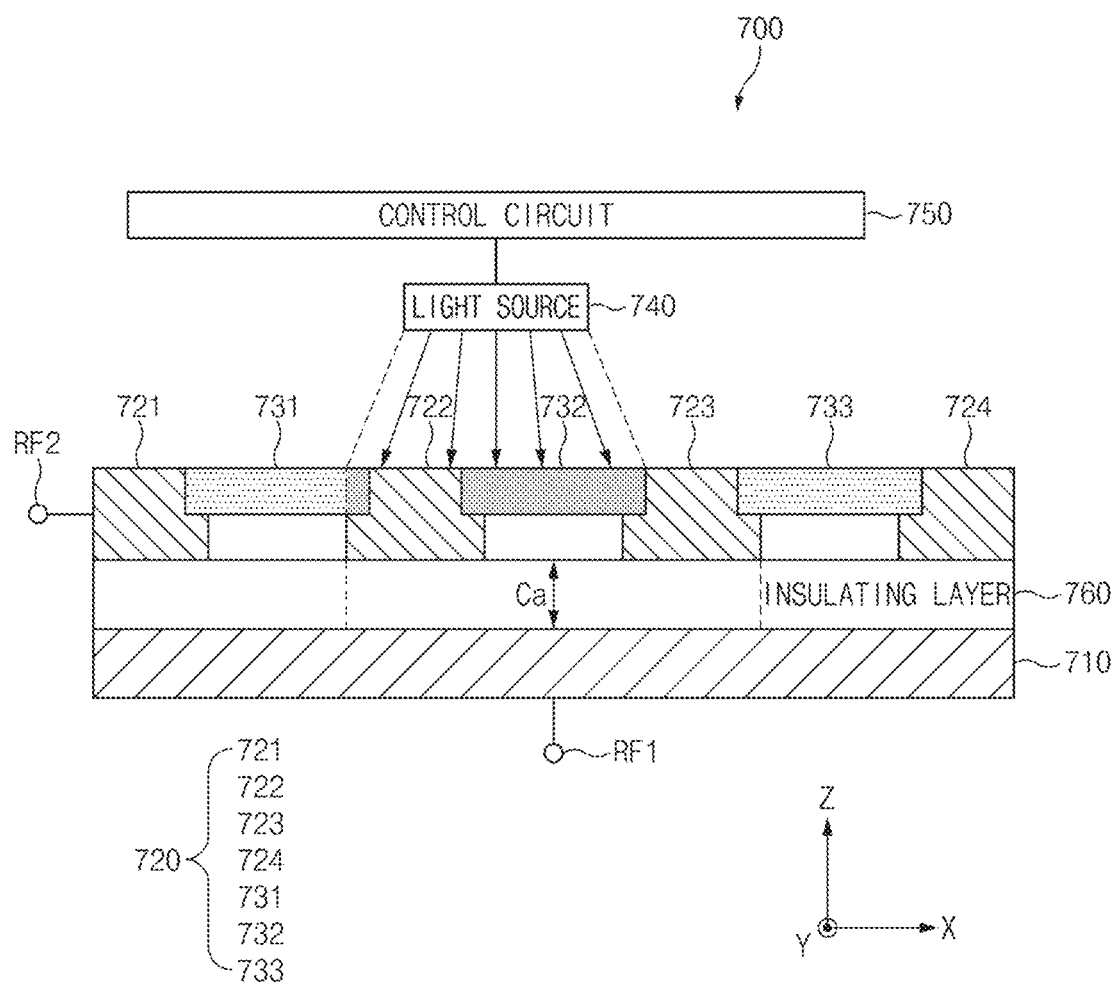
FIGS. 8A and 8B are diagrams illustrating how a capacitor device according to various embodiments of the disclosure.
Figure 8B:
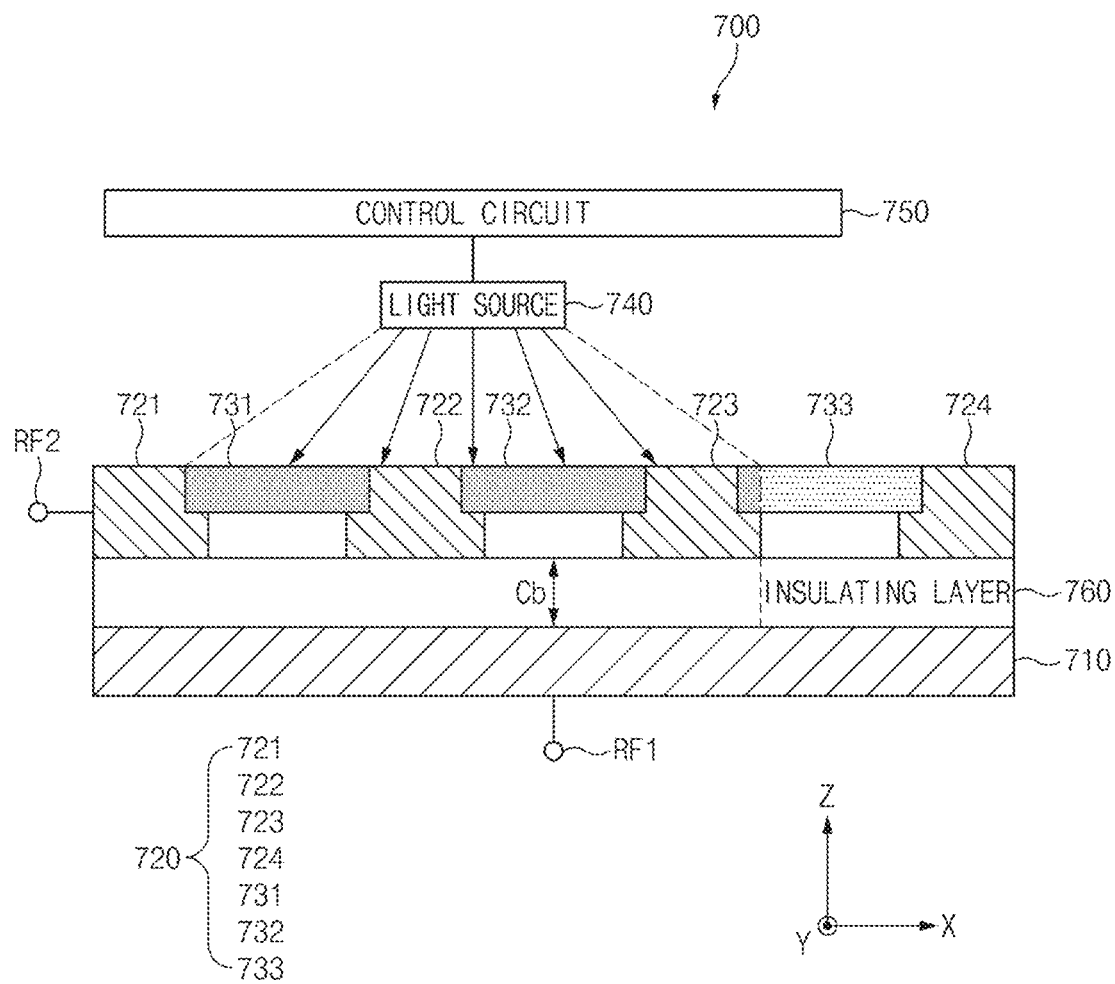

FIGS. 8A and 8B are diagrams illustrating how a capacitor device 700 according to various embodiments of the disclosure.

Referring to FIGS. 8A and 8B, the capacitor device 700 may include a first conductive layer 710, a second conductive layer 720, a light source 740, a control circuit 750, and an insulating layer 760. Functions of the first conductive layer 710, the second conductive layer 720, the light source 740, the control circuit 750, and the insulating layer 760 of the capacitor device 700 according to another embodiment are identical to the functions of the first conductive layer 510, the second conductive layer 520, the one or more light sources 541, 542, and 543, the control circuit 550, and the insulating layer 560 of the capacitor device 500 according to an embodiment, and thus, additional description will be omitted to avoid redundancy.

In an embodiment, the light source 740 may be spaced from the second conductive layer 720 as much as a specified interval in the Z-axis direction. The light source 740 may output a light on a surface of the second conductive layer 720. The light source 740 may control an angle of a light to be output. The area of the second conductive layer 720 exposed to a light may vary depending on the angle of the light that the light source 740 outputs.

In an embodiment, the control circuit 750 may control an angle of a light that the light source 740 outputs toward the second conductive layer 720. The control circuit 750 may control an angle of a light to be output, depending on a magnitude of a target capacitance to be formed between the first and second conductive layers 710 and 720.

Referring to FIG. 8A, when an angle of a light output from the light source 740 is small, an area of the second conductive layer 720, which is exposed to the light output from the light source 740, may decrease. Only the photo-conductive member 732 that is positioned in an area exposed to the light output from the light source 740 may be converted into a conductive material, and the photo-conductive member 731 and 733 that partially have an influence of the light source 740 or are not affected by the light source 740 may have a characteristic of a nonconductor. As such, a first conductor 721 of a plurality of conductors 721, 722, 723, and 724 included in the second conductive layer 720 may maintain a separated state, and only the second and third conductors 722 and 723 may be connected.

In an embodiment, the second RF signal terminal RF2 may be connected to the first conductor 721 included in the second conductive layer 720. As illustrated in FIG. 8A, when the first conductor 721 is electrically separated from the remaining conductors 722, 723, and 724, an electrical signal from the second RF signal terminal RF2 may be supplied only to the first conductor 721. As such, a capacitance formed between the first conductive layer 710 and the second conductive layer 720 may be identical to a capacitance formed between the first conductive layer 710 and the first conductor 721. Even in the case of connecting the second RF signal terminal RF2 to the second conductor 722, the second conductor 722 and the third conductor 723 may form a capacitance Ca together with the first conductive layer 710.

Referring to FIG. 8B, when an angle of a light output from the light source 740 is great, an area of the second conductive layer 720, which is exposed to the light output from the light source 740, may increase. The photo-conductive members 731 and 732 that are positioned in an area exposed to the light output from the light source 740 may be converted into a conductive material, and the photo-conductive member 733 that partially have an influence of the light source 740 may have a characteristic of a nonconductor. As such, the first to third conductors 721 to 723 of the plurality of conductors 721, 722, 723, and 724 included in the second conductive layer 720 may be connected.

In an embodiment, the second RF signal terminal RF2 may be connected to the first conductor 721 included in the second conductive layer 720. As illustrated in FIG. 8B, when the first conductor 721 is electrically connected with the second and third conductors 722 and 723, an electrical signal from the second RF signal terminal RF2 may be supplied to the first to third conductors 721 to 723. As such, a capacitance formed between the first conductive layer 710 and the second conductive layer 720 may be identical to a capacitance Cb formed between the first conductive layer 710 and the first to third conductors 721 to 723. The capacitance Cb formed between the first conductive layer 710 and the first to third conductors 721 to 723 may be greater than the capacitance Ca that the second conductor 722 and the third conductor 723 form together with the first conductive layer 710. As such, it may be identified that a magnitude of a capacitance formed between the first and second conductive layers 710 and 720 increases as an angle of a light output from the light source 740 increases.

In an embodiment, the control circuit 750 may increase an angle of the light output from the one or more light sources 740 to increase an area of a photo-conductive member converted into a conductive material in response to the light.

In an embodiment, the control circuit 750 may increase an intensity of the light output from the one or more light sources 740 to increase a capacitance value between the first conductive layer 710 and the second conductive layer 720.

Figure 8C:
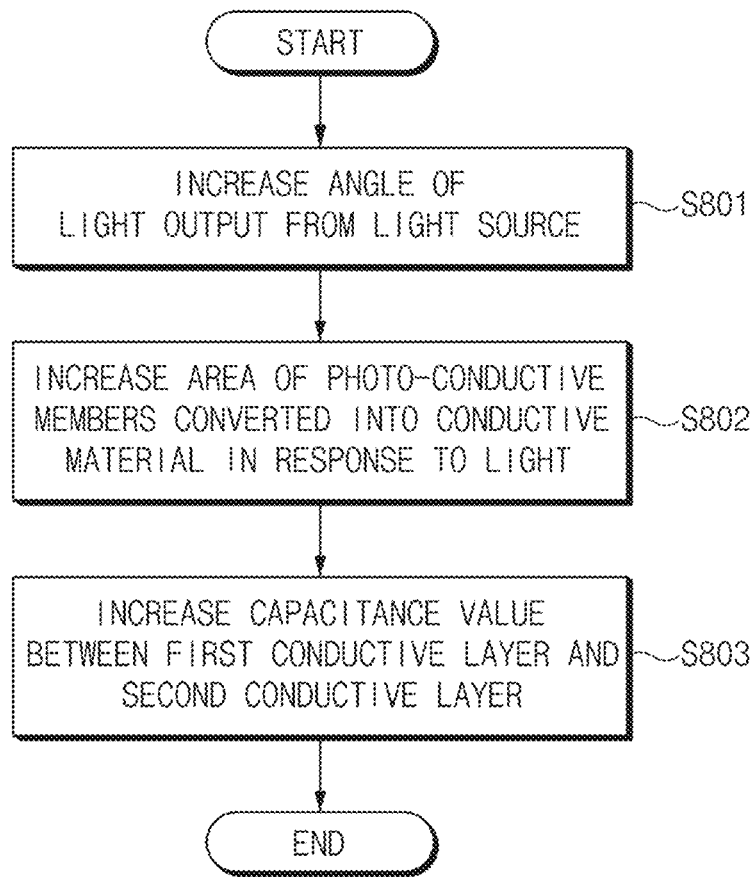
FIG. 8C is a flowchart illustrating a detailed operation of a control circuit of a capacitor device according to an embodiment of the disclosure.

FIG. 8C is a flowchart illustrating a detailed operation of the control circuit 750 of the capacitor device 700 according to an embodiment of the disclosure.

Referring to FIG. 8C, in operation 5801, the control circuit 750 of the capacitor device 700 according to another embodiment may increase an angle of a light output from the light source 740.

In operation 5802, the control circuit 750 of the capacitor device 700 according to another embodiment may increase an area of the photo-conductive members 731, 732, and 733 converted into a conductive material in response to the light.

In operation 5803, the control circuit 750 of the capacitor device 700 according to another embodiment may increase a capacitance value between the first conductive layer 710 and the second conductive layer 720.

Figure 9:
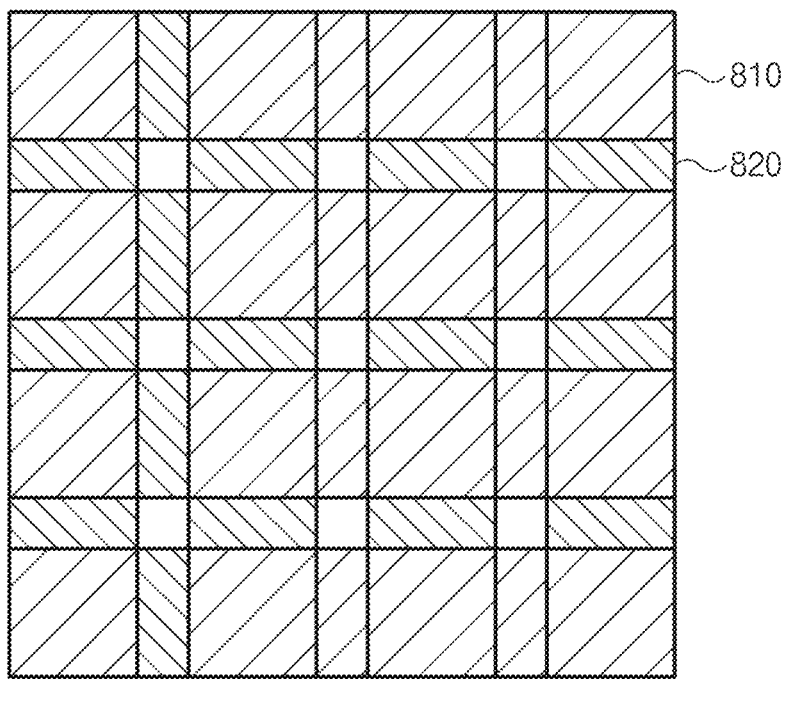
FIGS. 9, 10, and 11 are diagrams illustrating a second conductive layer of a capacitor device according to various embodiments of the disclosure.
Figure 9:
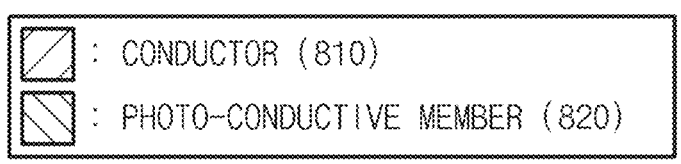
Figure 10:
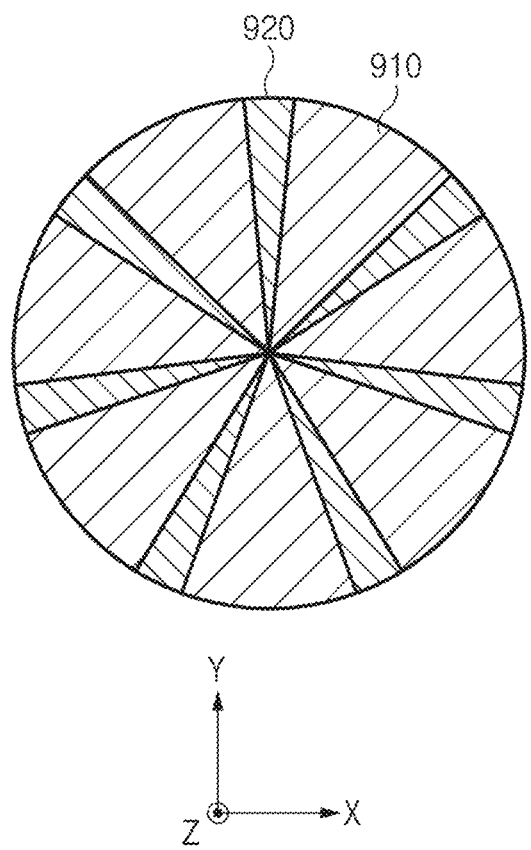
Figure 10:
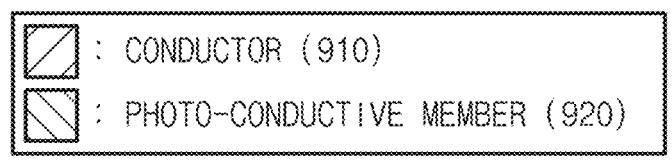
Figure 11:
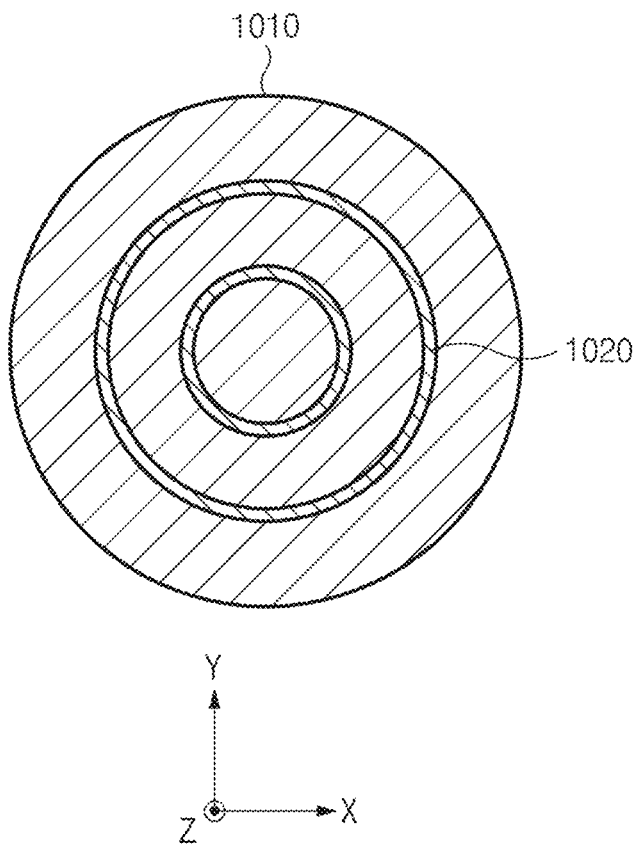

FIGS. 9 to 11 are diagrams illustrating a second conductive layer (e.g., the second conductive layer 520 of FIG. 5A) of a capacitor device according to various embodiments of the disclosure.

Referring to FIG. 9, a second conductive layer of a capacitor device may include a plurality of conductors 810 and one or more photo-conductive members 820. The plurality of conductors 810 may be arranged to have a pattern in which a rectangle is repeated on the second conductive layer of a rectangular shape formed along an XY plane. The plurality of conductors 810 may be spaced from each other. For example, the plurality of conductors 810 may be spaced from each other as much as a given interval in the X-axis direction and the Y-axis direction.

In an embodiment, the one or more photo-conductive members 820 may be positioned between the plurality of conductors 810. The one or more photo-conductive members 820 may have a rectangular shape. The one or more photo-conductive members 820 may be positioned adjacent to the plurality of conductors 810 in the X-axis direction and the Y-axis direction. The one or more photo-conductive members 820 may connect the conductors 810 that are adjacent in the X-axis direction and the Y-axis direction.

In an embodiment, in the case where a light is output to the one or more photo-conductive members 820, the one or more photo-conductive members 820 may be converted into a conductive material. The photo-conductive member 820 converted into a conductive material may connect the conductors 810 that are adjacent in the X-axis direction and the Y-axis direction. As the number of photo-conductive members 820 converted into a conductive material increases, the area of the conductors 810 electrically connected in the second conductive layer may increases, and thus, a magnitude of a capacitance formed between a first conductive layer (e.g., the first conductive layer 510 of FIG. 5A) extending in the Z-axis direction and the second conductive layer may increase.

Referring to FIG. 10, the second conductive layer of the capacitor device may include a plurality of conductors 910 and one or more photo-conductive members 920. The plurality of conductors 910 may be arranged in the form of a plurality of circular sectors divided with respect to the center of the second conductive layer of a circular shape formed along the XY plane. The plurality of conductors 910 may be spaced from each other. For example, radius portions of circular sectors of the plurality of conductors 910 may be spaced from each other as much as a given interval.

In an embodiment, the one or more photo-conductive members 920 may be positioned between the plurality of conductors 910. The one or more photo-conductive members 920 may be in the form of a circular sector. The one or more photo-conductive members 920 may be positioned adjacent to the radius portions of the plurality of conductors 910. The one or more photo-conductive members 920 may connect the conductors 910, the radius portions of which are adjacent.

In an embodiment, in the case where a light is output to the one or more photo-conductive members 920, the one or more photo-conductive members 920 may be converted into a conductive material. The photo-conductive member 920 converted into a conductive material may connect the conductors 910, the radius portions of which are adjacent. As the number of photo-conductive members 920 converted into a conductive material increases, the number of conductors 910 electrically connected in the second conductive layer may increases, and thus, a magnitude of a capacitance formed between a first conductive layer (e.g., the first conductive layer 510 of FIG. 5A) extending in the Z-axis direction and the second conductive layer may increase.

Referring to FIG. 11, the second conductive layer of the capacitor device may include a plurality of conductors 1010 and one or more photo-conductive members 1020. The plurality of conductors 1010 may be arranged in the form of a plurality of concentric circles defined by dividing the second conductive layer of a circular shape formed along the XY plane. The plurality of conductors 1010 may be spaced from each other. For example, the concentric circles defining the plurality of conductors 1010 may be spaced from each other as much as a given interval.

In an embodiment, the one or more photo-conductive members 1020 may be positioned between the plurality of conductors 1010. The one or more photo-conductive members 1020 may be in the form of a concentric circle. The one or more photo-conductive members 1020 may be positioned between edges of adjacent concentric circles defining the plurality of conductors 1010. The one or more photo-conductive members 1020 may connect the conductors 1010 that are adjacent.

In an embodiment, in the case where a light is output to the one or more photo-conductive members 1020, the one or more photo-conductive members 1020 may be converted into a conductive material. The photo-conductive member 1020 converted into a conductive material may connect the conductors 1010 adjacent to the photo-conductive member 1020 converted into a conductive material. As the number of photo-conductive members 1020 converted into a conductive material increases, the number of conductors 1010 electrically connected in the second conductive layer may increase, and thus, a magnitude of a capacitance formed between a first conductive layer (e.g., the first conductive layer 510 of FIG. 5A) extending in the Z-axis direction and the second conductive layer may increase.

Figure 12:
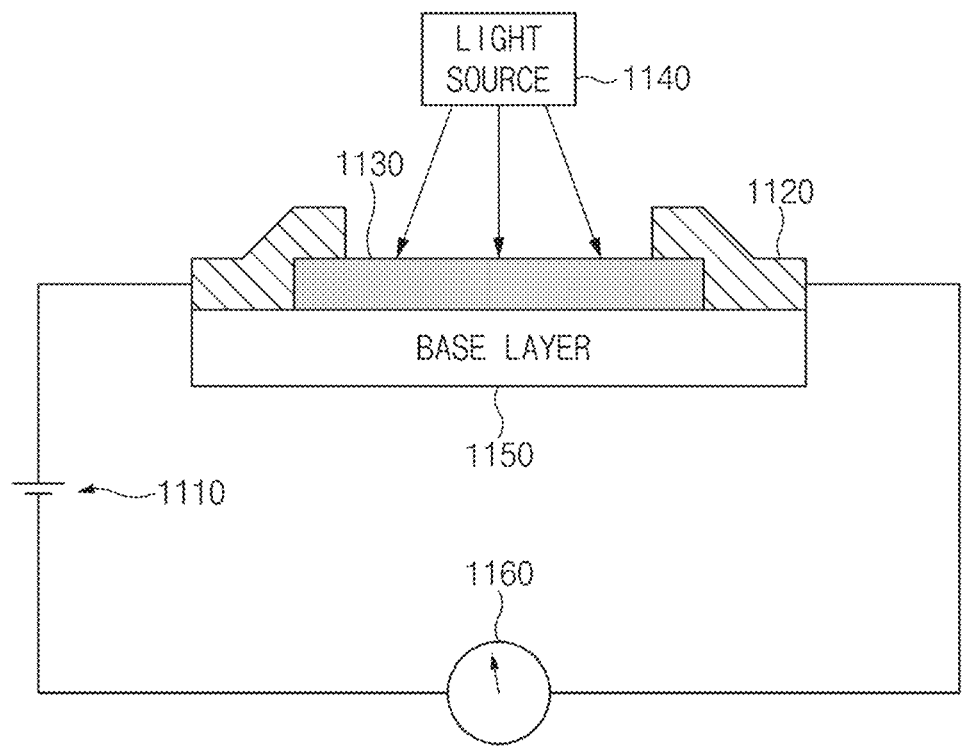
FIG. 12 is a diagram illustrating an application of a photo-conductive member according to an embodiment of the disclosure.

FIG. 12 is a diagram illustrating an application of a photo-conductive member 1130 according to an embodiment of the disclosure.

Referring to FIG. 12, a photo-conductive member 1130 may implement a variable impedance circuit. The variable impedance circuit may include a power source 1110, an electrode 1120, the photo-conductive member 1130, a light source 1140, a base layer 1150, and a meter 1160.

In an embodiment, the power source 1110 may supply a specified voltage to the electrode 1120. The power source 1110 may supply a direct current (DC) voltage or an alternating current (AC) voltage.

In an embodiment, the electrode 1120 may be connected with opposite ends of the power source 1110 by using wires. The electrode 1120 may include two conductors. The electrode 1120 may be supplied with a voltage from the power source 1110. When the power source 1110 supplies the DC voltage, the conductors may be connected to the opposite sides of the power source 1110 to have different polarities, with the power source 1110 interposed therebetween. When the power source 1110 supplies the AC voltage, the conductors may be connected to the opposite sides of the power source 1110 to have different phases, with the power source 1110 interposed therebetween.

In an embodiment, the photo-conductive member 1130 may be connected with the electrode 1120. The photo-conductive member 1130 may be interposed between the two conductors of the electrode 1120. The photo-conductive member 1130 may have a characteristic of a nonconductor when a light is not incident on the photo-conductive member 1130. The photo-conductive member 1130 may be converted into a conductive material when a light is incident on the photo-conductive member 1130.

In an embodiment, the light source 1140 may output a specified light toward the photo-conductive member 1130. When the light source 1140 outputs a light, the photo-conductive member 1130 may be converted into a conductive material, and thus, the impedance between the conductors of the electrode 1120 may decrease. As such, the impedance between the conductors of the electrode 1120 may be controlled by controlling the light output from the light source 1140.

In an embodiment, the base layer 1150 may support the electrode 1120 and the photo-conductive member 1130. The base layer 1150 may be formed on an insulating material. For example, the base layer 1150 may be formed on a ceramic material.

In an embodiment, the meter 1160 may be connected in series with a wire that is connected with the power source 1110. The meter 1160 may measure a current flowing through the wire connected with the power source 1110. When a voltage of the power source 1110 has a specified value, the impedance of the variable impedance circuit may be measured by using a current measured by the meter 1160.

Figure 13:
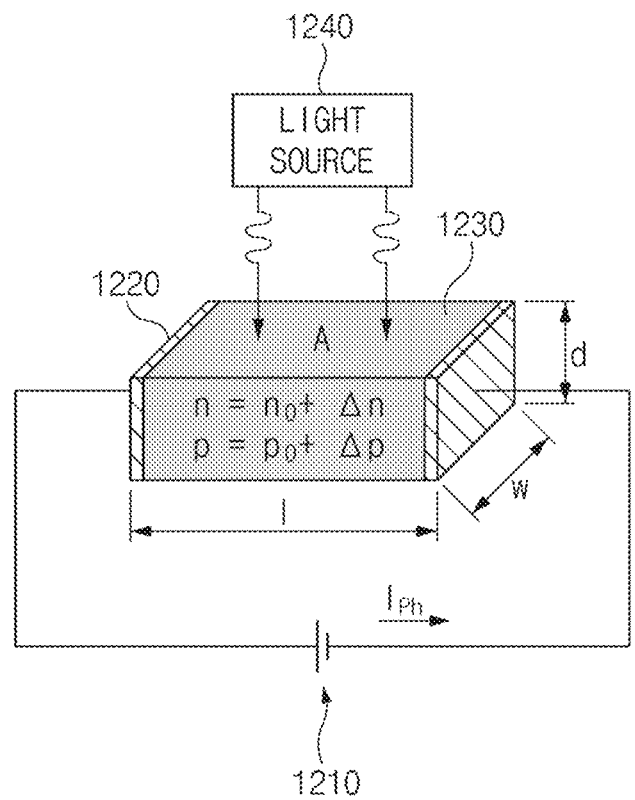
FIG. 13 is a diagram illustrating an operating principle of a photo-conductive member according to an embodiment of the disclosure.

FIG. 13 is a diagram illustrating an operating principle of a photo-conductive member 1230 according to an embodiment of the disclosure.

Referring to FIG. 13, a power source 1210, an electrode 1220, the photo-conductive member 1230, and a light source 1240 may be connected to describe an operating principle. The power source 1210, the electrode 1220, the photo-conductive member 1230, and the light source 1240 of FIG. 13 are identical to the power source 1110, the electrode 1120, the photo-conductive member 1130, and the light source 1140 of FIG. 12, and thus, additional description will be omitted to avoid redundancy.

In an embodiment, the electrode 1220 may include two conductors. In FIG. 13, "w" and "d" may represent a width and a height of each of two conductors of the electrode 1220, and "l" may represent a distance between the two conductors of the electrode 1220.

In an embodiment, the photo-conductive member 1230 may be interposed between the two conductors of the electrode 1220. In the case where the thickness of each conductor of the electrode 1220 is very smaller than the distance between the conductors thereof, a width of the photo-conductive member 1230 may be "w", a height of the photo-conductive member 1230 may be "d", and a length of the photo-conductive member 1230 may be "l". Because the physical size of the photo-conductive member 1230 is specified, a resistance value may be set depending on a resistivity value of the photo-conductive member 1230.

In an embodiment, the light source 1240 may output a specified light on one surface of the photo-conductive member 1230. In FIG. 13, "A" may represent the area of the photo-conductive member 1230, in which a light is able to be received. In the case where a light is incident on the photo-conductive member 1230, the number of n-type dopants in the photo-conductive member 1230 and the number of p-type dopants in the photo-conductive member 1230 may increase. In the photo-conductive member 1230, the number of n-type dopants and the number of p-type dopants may be proportional to the intensity of light output from the light source 1240 and "A" being the area in which a light is able to be received. In the case where n-type dopants and p-type dopants in the photo-conductive member 1230 increase in number, a resistance of the photo-conductive member 1230 may decrease, and thus, the intensity of current output from the power source 1210 may increase.

Figure 14:
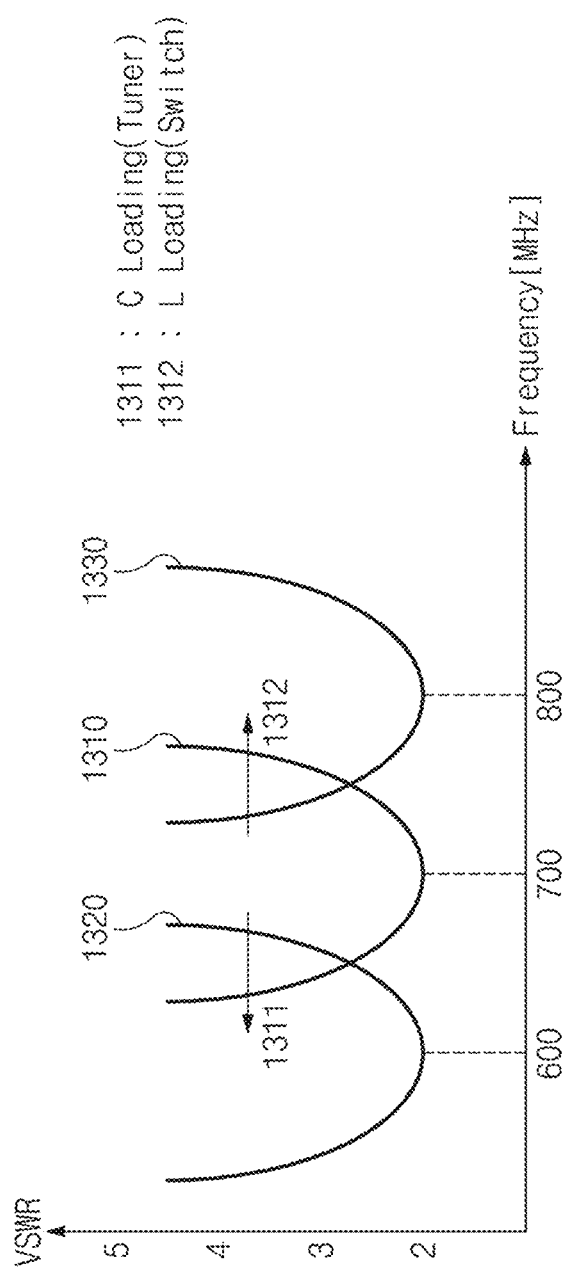
FIGS. 14 and 15 are graphs indicating an operation in which a tuner to which a capacitor device tunes a resonance frequency of an antenna according to various embodiments of the disclosure.
Figure 15:
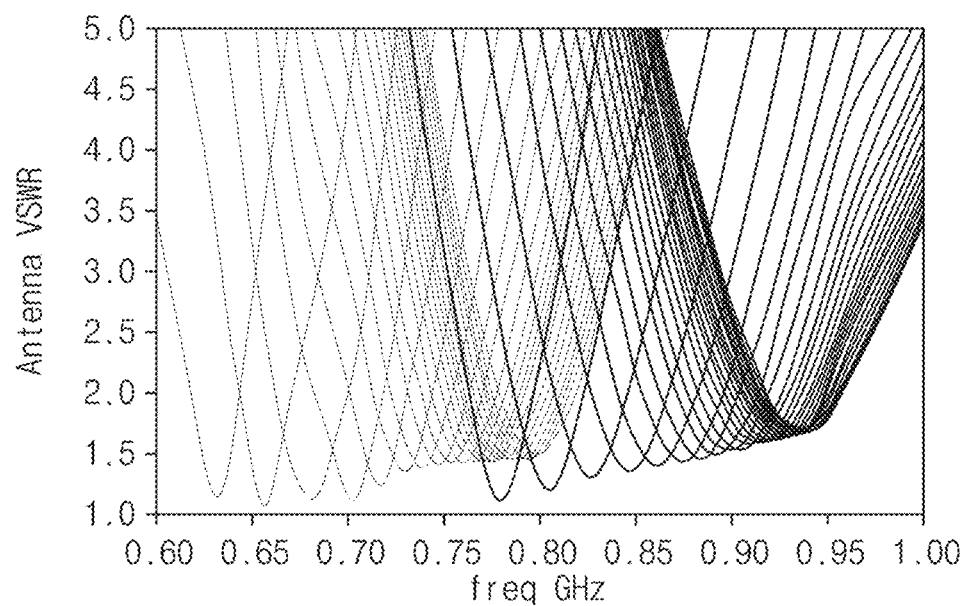

FIGS. 14 and 15 are graphs indicating an operation in which a tuner (e.g., the tuner 240 of FIG. 2A or 2B) to which a capacitor device (e.g., the capacitor device 500 of FIG. 5A) tunes a resonance frequency of an antenna (e.g., the antenna 260 of FIG. 2A or 2B) according to various embodiments of the disclosure.

Referring to FIGS. 14 and 15, a resonance frequency may be defined as a frequency where a voltage standing wave ratio (VSWR) being the ratio of the maximum to minimum voltage on an AC voltage is minimum. In the case of measuring a VSWR value of a tuner having a specified impedance value, the VSWR value may be minimum at a resonance frequency, and may increase in the case of being out of the resonance frequency.

In an embodiment, a first tuning graph 1310 of the tuner may have a resonance frequency value of about 700 MHz. The first tuning graph 1310 may be a graph before the tuner is tuned.

In an embodiment, in the case of performing a C Loading (1311) operation of varying a capacitance of the tuner, the resonance frequency of the tuner may decrease. C Loading 1311 may be performed by varying a capacitance itself of a variable capacitor (e.g., the capacitor device 500 of FIG. 5A) included in the turner. A second tuning graph 1320 being a resonance frequency graph of the tuner performing C Loading 1311 may have a resonance frequency value of about 600 MHz.

In an embodiment, in the case of performing an L Loading (1312) operation of varying an inductance of the tuner, the resonance frequency of the tuner may increase. L Loading 1312 may be performed by using a switch (e.g., the switch 480 of FIG. 4) connected with the tuner. A third tuning graph 1330 being a resonance frequency graph of the tuner performing L Loading 1312 may have a resonance frequency value of about 800 MHz.

In an embodiment, a resonance frequency value of an antenna and a VSWR value according to the resonance frequency may variously vary as illustrated in FIG. 14. In this case, the VSWR value may be changed more accurately in the case of varying a capacitance of a variable capacitor included in a tuner connected with an antenna. In particular, the VSWR value may be changed more accurately in a frequency band ranging from about 0.75 GHz or higher to about 0.80 GHz or lower and in a frequency band ranging from about 0.85 GHz or higher to about 0.90 GHz or lower. As such, it may be observed that a VSWR value of an antenna may be adjusted better by adjusting a variable capacitor included in the tuner.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments of the disclosure, it may be possible to reduce the loss occurring in an antenna and to improve performance, by increasing a resistance between conductive layers that are included in a variable capacitor and are opposite to each other.

According to various embodiments of the disclosure, the performance of antenna may be improved by decreasing a minimum value of a capacitance capable of being implemented with a variable capacitor.

According to various embodiments of the disclosure, an antenna resonance frequency switching band may be easily controlled by increasing a maximum value of a capacitance capable of being implemented with a variable capacitor and decreasing an operation between capacitance values.

According to various embodiments of the disclosure, a conductive layer for an electrode of a variable capacitor may be fixed to have a semi-permanent characteristic.

According to various embodiments of the disclosure, an excellent peak voltage characteristic of a variable capacitor may make it possible to implement a tuner without a restriction of a switching operation due to an external factor and to improve the performance of antenna by using a limited space in an electronic device.

Besides, a variety of effects directly or indirectly understood through this disclosure may be provided.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
   a first conductive layer;
   a second conductive layer formed to be opposite to the first conductive layer, the second conductive layer including:
   a plurality of conductors that are electrically separated, and one or more photo-conductive members positioned to be connected between the plurality of conductors;

an insulating layer interposed between the first conductive layer and the second conductive layer;

one or more light sources positioned to face the one or more photo-conductive members; and a control circuit configured to output a specified light through at least one light source of the one or more light sources such that an electric conductivity of the one or more photo-conductive members increases in response to a light, from among the one or more photo-conductive members, wherein at least some of the plurality of conductors that are electrically connected with the one or more photo-conductive members are connected, and a capacitance value between the first conductive layer and the second conductive layer is changed.

2. The electronic device of claim 1, wherein the plurality of conductors are separated from each other and are in contact with one surface of the insulating layer, and wherein the one or more photo-conductive members are spaced from the insulating layer.

3. The electronic device of claim 1, wherein the first conductive layer is connected with an antenna, and wherein the second conductive layer is connected with a front end module (FEM).

4. The electronic device of claim 1, wherein the control circuit is further configured to:

increase a number of light sources outputting the light from among the one or more light sources to increase an electric conductivity of a photo-conductive member reacting to the light.

5. The electronic device of claim 1, wherein the control circuit is further configured to:

increase an intensity of the light output from the one or more light sources to increase an electric conductivity of a photo-conductive member reacting to the light.

6. The electronic device of claim 1, wherein the control circuit is further configured to:

increase a number of light sources outputting the light from among the one or more light sources to increase a capacitance value between the first conductive layer and the second conductive layer.

7. The electronic device of claim 1, wherein the control circuit is further configured to:

increase an intensity of the light output from the one or more light sources to increase a capacitance value between the first conductive layer and the second conductive layer.

8. The electronic device of claim 1, wherein the plurality of conductors are spaced from each other in a first direction and a second direction perpendicular to the first direction, and wherein the one or more photo-conductive members are positioned between the plurality of conductors.

9. The electronic device of claim 1, wherein the plurality of conductors are positioned in circular form so as to be spaced from each other, and wherein the one or more photo-conductive members are positioned between the plurality of conductors.

10. A capacitor device comprising:

one or more light sources;

a control circuit configured to control the one or more light sources;

a first conductive layer;

a second conductive layer formed to be opposite to the first conductive layer, the second conductive layer including:

a plurality of conductors that are electrically separated, and one or more photo-conductive members positioned to correspond to the one or more light sources in a state where the one or more photo-conductive members are connected between the plurality of conductors; and an insulating layer interposed between the first conductive layer and the second conductive layer.

11. The capacitor device of claim 10, wherein the one or more light sources are spaced from each other at a specified interval, wherein the one or more light sources output lights to one surface of the second conductive layer, and wherein the one surface of the second conductive layer is opposite to another surface of the second conductive layer, which is in contact with the insulating layer.

12. The capacitor device of claim 10, wherein the plurality of conductors are in contact with the insulating layer, and wherein the one or more photo-conductive members are spaced from the insulating layer as much as a specified distance.

13. The capacitor device of claim 10, wherein the control circuit is configured to:

control turning on or off of each of the one or more light sources, and an angle of a light to be output.

14. The capacitor device of claim 10, wherein the one or more photo-conductive members receive light output by the one or more light sources, to electrically connect the plurality of conductors.

15. The capacitor device of claim 10, wherein the control circuit is further configured to:

increase a capacitance value between the first conductive layer and the second conductive layer by increasing a number of light sources turned on from among the one or more light sources or an angle of a light to be output from each of the one or more light sources.

16. An electronic device comprising:

a first conductive layer;

a second conductive layer formed to be opposite to the first conductive layer, the second conductive layer including:

a plurality of conductors that are electrically separated, and one or more photo-conductive members connected between the plurality of conductors;

an insulating layer interposed between the first conductive layer and the second conductive layer;

one or more light sources positioned to face the one or more photo-conductive members; and a control circuit configured to output a specified light through at least one light source of the one or more light sources such that at least some of the plurality of conductors are electrically connected via the one or more photo-conductive members, and a capacitance value between the first conductive layer and the second conductive layer is changed.

17. The electronic device of claim 16, wherein the plurality of conductors are separated from each other and are in contact with one surface of the insulating layer, and wherein the one or more photo-conductive members are spaced from the insulating layer.

18. The electronic device of claim 16,
wherein the first conductive layer is connected with an antenna, and
wherein the second conductive layer is connected with a front end module (FEM).

19. The electronic device of claim 16, wherein the control circuit is further configured to:
increase a number of light sources that output light from among the one or more light sources to increase an area of a photo-conductive member converted into a conductive material in response to the light.

20. The electronic device of claim 16, wherein the control circuit is further configured to:
increase an angle of the light output from the one or more light sources to increase an area of a photo-conductive member converted into a conductive material in response to the light.

* * * * *